(12) United States Patent
Shishido et al.

(10) Patent No.: US 9,939,723 B2
(45) Date of Patent: Apr. 10, 2018

(54) MASK BLANK, METHOD OF MANUFACTURING PHASE SHIFT MASK, PHASE SHIFT MASK, AND METHOD OF MANUFACTURING SEMICONDUCTOR DEVICE

(71) Applicant: HOYA CORPORATION, Tokyo (JP)

(72) Inventors: Hiroaki Shishido, Tokyo (JP); Osamu Nozawa, Tokyo (JP); Takashi Uchida, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 67 days.

(21) Appl. No.: 15/122,453

(22) PCT Filed: Feb. 24, 2015

(86) PCT No.: PCT/JP2015/055125
§ 371 (c)(1),
(2) Date: Aug. 30, 2016

(87) PCT Pub. No.: WO2015/146421
PCT Pub. Date: Oct. 1, 2015

(65) Prior Publication Data
US 2017/0075210 A1    Mar. 16, 2017

(30) Foreign Application Priority Data

Mar. 28, 2014  (JP) ................................. 2014-069811

(51) Int. Cl.
| | | |
|---|---|---|
| G03F 1/32 | (2012.01) | |
| G03F 1/58 | (2012.01) | |
| G03F 1/80 | (2012.01) | |
| G03F 7/20 | (2006.01) | |
| G03F 7/34 | (2006.01) | |
| H01L 21/308 | (2006.01) | |

(52) U.S. Cl.
CPC .................. *G03F 1/32* (2013.01); *G03F 1/58* (2013.01); *G03F 1/80* (2013.01); *G03F 7/20* (2013.01); *G03F 7/34* (2013.01); *H01L 21/3081* (2013.01); *H01L 21/3086* (2013.01)

(58) Field of Classification Search
CPC ..... G03F 1/32; G03F 1/58; G03F 1/80; G03F 7/20; G03F 7/34; H01L 21/3081; H01L 21/3086

USPC ............................................................ 435/5
See application file for complete search history.

(56) References Cited

U.S. PATENT DOCUMENTS

| | | |
|---|---|---|
| 2005/0019674 A1 | 1/2005 | Okubo et al. |
| 2007/0020534 A1 | 1/2007 | Yoshikawa et al. |
| 2010/0176087 A1 | 7/2010 | Igarashi et al. |
| 2011/0111332 A1 | 5/2011 | Iwashita et al. |
| 2012/0156596 A1 | 6/2012 | Kominato et al. |
| 2013/0309598 A1 | 11/2013 | Fukaya et al. |
| 2013/0309601 A1 | 11/2013 | Fukaya et al. |

FOREIGN PATENT DOCUMENTS

| | | |
|---|---|---|
| JP | 2007-033469 A | 2/2007 |
| JP | 2012-141583 A | 7/2012 |
| JP | 2013-238776 A | 11/2013 |
| KR | 10-2010-0084130 A | 7/2010 |
| KR | 10-2013-0128338 A | 11/2013 |
| WO | 2004/090635 A1 | 10/2004 |
| WO | 2009/157506 A1 | 12/2009 |

OTHER PUBLICATIONS

Communication dated Oct. 20, 2016, from the Korean Intellectual Patent Office, in counterpart Korean application No. 10-2016-7023728.
International Search Report of PCT/JP2015/055125 dated Apr. 7, 2015 [PCT/ISA/210].

*Primary Examiner* — Christopher G Young
(74) *Attorney, Agent, or Firm* — Sughrue Mion, PLLC

(57) ABSTRACT

A mask blank having a structure in which, on a transparent substrate, a phase shift film, a light shielding film, and a hard mask film are laminated in the stated order from the transparent substrate side. The phase shift film is formed of a material containing silicon, the hard mask film is formed of a material containing at least one element selected from silicon and tantalum, and the light shielding film is formed of a material containing chromium. The mask blank has a structure in which the following three layers: a lower layer, an intermediate layer, and an upper layer are laminated, the upper layer having a highest content of chromium in the light shielding film, the intermediate layer having a lowest content of chromium in the light shielding film, and containing at least one metallic element selected from indium, tin, and molybdenum.

29 Claims, 5 Drawing Sheets

MASK BLANK, METHOD OF MANUFACTURING PHASE SHIFT MASK, PHASE SHIFT MASK, AND METHOD OF MANUFACTURING SEMICONDUCTOR DEVICE

CROSS REFERENCE TO RELATED APPLICATIONS

This application is a National Stage of International Application No. PCT/JP2015/055125, filed Feb. 24, 2015, claiming priority based on Japanese Patent Application No. 2014-069811, filed Mar. 28, 2014, the contents of all of which are incorporated herein by reference in their entirety.

TECHNICAL FIELD

This invention relates to a mask blank for a halftone-type phase shift mask, a phase shift mask using the mask blank, and a method of manufacturing a phase shift mask, and further a method of manufacturing a semiconductor device.

BACKGROUND ART

As a mask blank for a halftone-type phase shift mask, there is known a mask blank having the structure in which a semitransparent phase shift film made of a metal silicide-based material, a chromium film (light shielding film) made of a chromium-based compound, and an etching mask film (hard mask film) made of an inorganic-based material are laminated from a substrate side. When a phase shift mask is to be produced using such mask blank, first, an etching mask film is patterned by dry etching using a fluorine-based gas and using as a mask a resist pattern which is formed on a front surface of the mask blank. Then, a light shielding film is patterned by dry etching using a mixture gas of chlorine and oxygen and using the etching mask film as a mask, and further, a phase shift film is patterned by dry etching using a fluorine-based gas and using the pattern of the light shielding film as a mask (see WO-A-2004/090635 (Patent Document 1)).

Meanwhile, in order to increase an etching rate with optical characteristics of the light shielding film of the chromium-based compound kept unchanged, proposal has been made about the structure in which the light shielding film is made of a chromium-based material containing tin. In this case, when an upper layer of the light shielding film is a layer containing no tin or having a low content ratio of tin, and a lower layer thereof is a layer having a high content ratio of tin, only an etching rate of the lower layer (on the substrate side) may be improved over an etching rate of the upper layer (on a front surface side), and hence over-etching time may be set short. On the other hand, when the content ratio of tin on the substrate side is set low, an end point of etching may be detected more easily by monitoring chromium during the dry etching (see JP-A-2013-238776 (Patent Document 2)).

PRIOR ART DOCUMENTS

Patent Document

Patent Document 1: WO-A-2004/090635
Patent Document 2: JP-A-2013-238776

SUMMARY OF THE INVENTION

Problem to be Solved by the Invention

In the mask blank as described in Patent Document 1, the light shielding film made of the chromium-based compound is required to have a light shielding property of reducing exposure light, which has been transmitted through a halftone film, to a predetermined amount of light. When the phase shift mask is to be produced from the mask blank, a pattern including a light shielding ring or band is formed in the light shielding film. Then, a laminate structure of the phase shift film and the light shielding film is required to satisfy a predetermined optical density. At the same time, the light shielding film is required to function as an etching mask when the phase shift film is pattered by dry etching using the fluorine-based gas to form the phase shift patter. In a finishing stage of the phase shift mask, a relatively sparse patter, such as the light shielding patter, is commonly formed in the light shielding film. However, in the course of manufacturing the phase shift mask from the mask blank, the light shielding film is required to function as the etching mask when the phase shift patter, which is a fine transfer patter, is formed in the phase shift film. Therefore, it is desired to be able to also form the fine pattern in the light shielding film with high dimensional accuracy.

In order to be able to form the fine pattern in the light shielding film made of the chromium-based compound with high dimensional accuracy by the dry etching using the mixture gas of the chlorine-based gas and the oxygen gas, it is necessary to reduce etching time required to finish forming the fine pattern in the light shielding film. A thickness of the light shielding film may be reduced to reduce the etching time. However, as described above, the light shielding film needs to ensure the predetermined optical density with respect to the exposure light, and reducing the thickness of the light shielding film has its limit. Therefore, it is required to increase the etching rate of the light shielding film.

As a content of chromium in the light shielding film becomes lower, and as a content of oxygen becomes higher, the etching rate tends to become higher. However, as the content of chromium in the light shielding film becomes lower, an extinction coefficient k of the material forming the light shielding film becomes smaller. In other words, optical density of the light shielding film becomes lower. There is a trade-off relationship between the etching rate for the dry etching using the mixture gas of the chlorine-based gas and the oxygen gas and the optical density with respect to the exposure light in the light shielding film.

On the one hand, the dry etching using the mixture gas of the chlorine-based gas and the oxygen gas as an etching gas has a low tendency toward anisotropic etching, and a high tendency toward isotropic etching. Therefore, during the dry etching for patterning the light shielding film made of the chromium-based compound, not only etching that proceeds from the front surface side of the light shielding film to a phase shift film side, but also etching that proceeds in a direction of a side wall of the light shielding film, that is, so-called side etching, is prone to occur. The side etching proceeds more easily as the material has a higher etching rate. When the light shielding film is formed of a material having a relatively high etching rate (for example, material having a low content of chromium), the etching side wall is eroded by the etching gas, and a cross section of the light shielding film pattern tends to become a hollow shape. When the light shielding film is formed of the material having the relatively high etching rate, and when a sub-resolution assist feature (SRAF) having a pattern dimension of 50 nm or less, for example, is formed by dry etching, a contact area between the light shielding film pattern and a base film (phase shift film) becomes smaller, and the pattern may fall.

On the other hand, when the light shielding film is formed of a material having a high content of chromium, the etching rate is low, and hence it becomes difficult to form the fine pattern in the plane with high accuracy. Therefore, also in this case, it is difficult to pattern the phase shift film, which is a lower layer, with high form accuracy in the etching using the light shielding film pattern as the mask.

In view of the above, it is an object of this invention to provide a mask blank for a halftone-type phase shift mask, which is capable of patterning a light shielding film made of a material containing chromium without collapse of a pattern with good form accuracy, and to provide a method of manufacturing a phase shift mask, which is capable of using the mask blank to form a phase shift pattern with good accuracy, and further to provide the phase shift mask obtained thereby, and a method of manufacturing a semiconductor device.

Means to Solve the Problem

This invention has the following configurations as means to solve the above-mentioned problems.

(Configuration 1)

A mask blank having a structure in which, on a transparent substrate, a phase shift film, a light shielding film, and a hard mask film are laminated in the stated order from a transparent substrate side, the phase shift film being formed of a material containing silicon, the hard mask film being formed of a material containing at least one element selected from silicon and tantalum, the light shielding film being formed of a material containing chromium, and having a laminated structure of three layers comprising a lower layer, an intermediate layer, and an upper layer, the upper layer having a highest content of chromium in the light shielding film, the intermediate layer having a lowest content of chromium in the light shielding film, and containing at least one metallic element selected from indium, tin, and molybdenum.

(Configuration 2)

The mask blank according to configuration 1, wherein the intermediate layer has a highest total content of the metallic element in the light shielding film.

(Configuration 3)

The mask blank according to configuration 1 or 2, wherein both of the upper layer and the lower layer do not contain the metallic element.

(Configuration 4)

A mask blank having a structure in which, on a transparent substrate, a phase shift film, a light shielding film, and a hard mask film are laminated in the stated order from a transparent substrate side, the phase shift film being formed of a material containing silicon, the hard mask film being formed of a material containing at least one element selected from silicon and tantalum, the light shielding film being formed of a material containing chromium, and having a laminated structure of a lower layer and an upper layer, the upper layer having a content of chromium higher than the lower layer, the lower layer having a graded composition so that a content of chromium becomes lower from a phase shift film side to an upper layer side, and containing at least one metallic element selected from indium, tin, and molybdenum on the upper layer side.

(Configuration 5)

The mask blank according to configuration 4, wherein a region of the upper layer side of the lower layer has a highest total content of the metallic element in the light shielding film.

(Configuration 6)

The mask blank according to configuration 4 or 5, wherein both of a region of the phase shift film side of the lower layer and the upper layer do not contain the metallic element.

(Configuration 7)

The mask blank according to any one of configurations 1 to 6, wherein the hard mask film is formed of a material containing silicon and oxygen.

(Configuration 8)

The mask blank according to any one of configurations 1 to 7, wherein the phase shift film is formed of a material containing silicon and nitrogen.

(Configuration 9)

The mask blank according to any one of configurations 1 to 8, wherein the light shielding film is capable of being patterned by dry etching using a mixture gas of a chlorine-based gas and an oxygen gas.

(Configuration 10)

The mask blank according to any one of configurations 1 to 9, wherein the hard mask film and the phase shift film are capable of being patterned by dry etching using a fluorine-based gas.

(Configuration 11)

A method of manufacturing a phase shift mask using the mask blank of any one of configurations 1 to 10, the method comprising the steps of:

forming a phase shift pattern in the hard mask film by dry etching using a fluorine-based gas and using as a mask a resist film having the phase shift pattern which is formed on the hard mask film;

forming the phase shift pattern in the light shielding film by dry etching using a mixture gas of a chlorine-based gas and an oxygen gas and using as a mask the hard mask film in which the phase shift pattern has been formed;

forming the phase shift pattern in the phase shift film and removing the hard mask film by dry etching using a fluorine-based gas and using as a mask the light shielding film in which the phase shift pattern has been formed; and forming, after removing the hard mask film, a light shielding pattern in the light shielding film by dry etching using a mixture gas of a chlorine gas and an oxygen gas and using as a mask a resist film having the light shielding pattern which is formed on the light shielding film.

(Configuration 12)

A phase shift mask having a structure in which, on a transparent substrate, a phase shift film in which a phase shift pattern is formed and a light shielding film in which a light shielding pattern is formed are laminated in the stated order from a transparent substrate side, the phase shift film being formed of a material containing silicon, the light shielding film being formed of a material containing chromium, and having a laminated structure of three layers comprising a lower layer, an intermediate layer, and an upper layer, the upper layer having a highest content of chromium in the light shielding film, the intermediate layer having a lowest content of chromium in the light shielding film, and containing at least one metallic element selected from indium, tin, and molybdenum.

(Configuration 13)

The phase shift mask according to configuration 12, wherein the intermediate layer has a highest total content of the metallic element in the light shielding film.

(Configuration 14)

The phase shift mask according to configuration 12 or 13, wherein both of the upper layer and the lower layer do not contain the metallic element.

(Configuration 15)

A phase shift mask having a structure in which, on a transparent substrate, a phase shift film in which a phase shift pattern is formed and a light shielding film in which a light shielding pattern is formed are laminated in the stated order from a transparent substrate side, the phase shift film being formed of a material containing silicon, the light shielding film being formed of a material containing chromium, and having a laminated structure of a lower layer and an upper layer, the upper layer having a content of chromium higher than the lower layer, the lower layer having a graded composition so that a content of chromium becomes lower from a phase shift film side to an upper layer side, and containing at least one metallic element selected from indium, tin, and molybdenum on the upper layer side.

(Configuration 16)

The phase shift mask according to configuration 15, wherein a region of the upper layer side of the lower layer has a highest total content of the metallic element in the light shielding film.

(Configuration 17)

The phase shift mask according to configuration 15 or 16, wherein both of a region of the phase shift film side of the lower layer and the upper layer do not contain the metallic element.

(Configuration 18)

The phase shift mask according to any one of configurations 12 to 17, wherein the phase shift film is formed of a material containing silicon and nitrogen.

(Configuration 19)

The phase shift mask according to any one of configurations 12 to 18, wherein the light shielding film is capable of being patterned by dry etching using a mixture gas of a chlorine-based gas and an oxygen gas.

(Configuration 20)

The phase shift mask according to any one of configurations 12 to 19, wherein the phase shift film is capable of being patterned by dry etching using a fluorine-based gas.

(Configuration 21)

A method of manufacturing a semiconductor device, comprising an exposure step of patterning and transferring a transfer pattern of a phase shift mask, which is produced by the method of manufacturing a phase shift mask of configuration 1, on a resist film on a substrate by a lithography method using the phase shift mask.

(Configuration 22)

A method of manufacturing a semiconductor device, comprising an exposure step of patterning and transferring a transfer pattern of the phase shift mask of any one of configurations 12 to 20 on a resist film on a substrate by a lithography method using the phase shift mask.

Effect of the Invention

According to this invention having the above-mentioned configurations, in the structure including, on the phase shift film, the light shielding film formed of the material containing chromium, there can be obtained the mask blank capable of avoiding collapse of the pattern while maintaining a good shape in plan view and good optical characteristics of the light shielding film pattern, which is formed by patterning the light shielding film. Moreover, the phase shift mask having the good pattern accuracy can be manufactured using the mask blank, and further, the pattern can be formed with good accuracy in the manufacturing of the semiconductor device using the phase shift mask.

MODES FOR EMBODYING THE INVENTION

Figure 1:
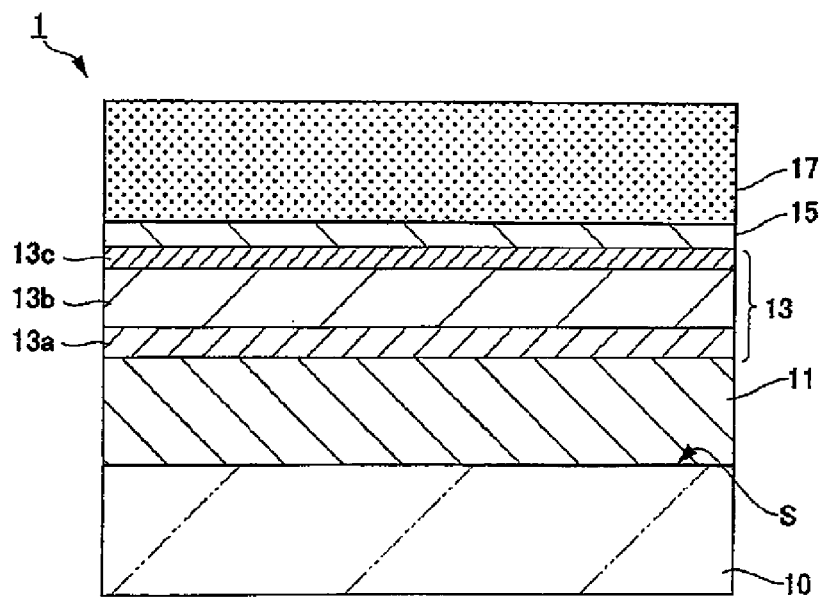
FIG. 1 is a cross-sectional view for illustrating the structure of a mask blank according to a first embodiment of this invention.

Along with miniaturization of a transfer pattern (phase shift pattern) formed in a phase shift film, a reduction in thickness of a resist film is and has been sought for. However, in a mask blank, a light shielding film is generally laminated on the phase shift film, and the resist film, in which the phase shift pattern is formed, is laminated on the light shielding film. Therefore, there is a need to pattern the light shielding film first by dry etching performed using as a mask the resist film in which the phase shift pattern is formed. When the light shielding film is formed of a chromium-based material, a mixture gas of a chlorine-based gas and an oxygen gas (chlorine-based gas containing oxygen) is used for the dry etching. However, the resist film made of an organic-based material has low resistance to the dry etching using the chlorine-based gas containing oxygen, and hence a thickness of the resist film needs to be increased. When a fine pattern having a small width is to be formed in the thick resist film, a ratio of a height with respect to the width of the resist pattern to be formed becomes much higher, and occurrence of collapse of the resist pattern and other such problems arise. Moreover, during dry etching on the light shielding film, the resist pattern is etched and eroded from above the pattern. At this time, a side wall direction of the pattern is also etched (side-etched) and eroded, if not to as large an extent as the amount of film reduced by the etching from above. A line width of the pattern to be formed in the resist film needs to be formed taking into consideration the erosion by the side etching in advance.

To address those problems, in recent years, there has been put into use a mask blank in which a hard mask film, which is made of a material having sufficient etching selectivity with respect to a chromium-based material for the dry etching using the chlorine-based gas containing oxygen, is provided on the light shielding film made of the chromium-based material. In the mask blank, the phase shift pattern is formed in the hard mask film by dry etching using as a mask the resist film (resist pattern) having the phase shift pattern. Then, dry etching using the chlorine-based gas containing oxygen and using as a mask the hard mask film having the phase shift pattern is performed on the light shielding film to form the phase shift pattern in the light shielding film. The hard mask film is generally formed of a material that is capable of being patterned by dry etching using a fluorine-based gas. The dry etching using the fluorine-based gas is etching mainly with ions, and hence has a high tendency toward anisotropic etching. The amount of side etching in the pattern side wall of the hard mask film, in which the phase shift pattern has been formed, is small.

It has been required to form the light shielding film, which is made of a material containing chromium, of a material having a high etching rate. However, the light shielding film made of the chromium-based material having the high etching rate has a tendency for the side etching to proceed more easily. In the dry etching performed in forming the phase shift pattern in the phase shift film, a fluorine-based gas is generally used. Therefore, in the dry etching of the phase shift film, a pattern of a hard mask film having a small amount of side etching cannot be used as a mask, and a pattern of a light shielding film having a large amount of side etching needs to be used as a mask. Moreover, the chromium-based material having the high etching rate usually has a low content of chromium, and hence tends to have a small extinction coefficient k. When a light shielding film having a predetermined optical density is to be formed of the chromium-based material having the high etching rate, a thickness needs to be increased.

When the light shielding film is formed of a material having a high content of chromium, which is a material having a low etching rate, the thickness of the light shielding film may be reduced. However, when the pattern is formed in the light shielding film by the dry etching, CD uniformity in the plane of the formed pattern is inevitably reduced. In general, in a case where the dry etching is performed on a thin film to form the pattern, even when the dry etching has a high tendency toward anisotropy, the etching for removing the thin film does not reach a lower end at the same time in the region in plan view. On the center side in the region in plan view in which the thin film is removed by the etching, the etching tends to proceed relatively fast, and on the side wall side, the etching tends to proceed relatively slow. Therefore, in the dry etching in patterning the thin film, it is a general practice to allow the etching on the side wall side of the thin film to proceed without being stopped at the stage of reaching a lower end surface of the thin film on the center side in the region in plan view in which the thin film is removed, that is, to perform etching (over etching) for raising the side wall of the pattern.

As the light shielding film using the chromium-based material, there have been proposed a large number of preferred specific structures of respective layers when the structure is formed by laminating a plurality of layers. However, in a mask blank in which, on a transparent substrate, a phase shift film made of a material that can be etched using a fluorine-based gas, a light shielding film made of a chromium-based material, and a hard mask film made of a material that can be etched using the fluorine-based gas are laminated in the stated order, thorough consideration has not been given to the preferred structure of the light shielding film. The inventors of this invention have conducted an intense research on the preferred structure of the light shielding film in such mask blank. As a result, the inventors have come to the conclusion that it is preferred to select a material having a lowest etching rate in the light shielding film with respect to the dry etching using the chlorine-based gas containing oxygen for an upper layer of the light shielding film, which is at a position closest to the hard mask film. The inventors have also come to the conclusion that it is preferred to select a material having a high etching rate with respect to the dry etching using the chlorine-based gas containing oxygen for layers other than the upper layer of the light shielding film.

When the light shielding film is dry-etched using the chlorine-based gas containing oxygen and using as a mask the hard mask film having the phase shift pattern, the light shielding film is etched from a hard mask film side to form the phase shift pattern. When the upper layer of the light shielding film, which is closest to the hard mask film, is made of a material having low susceptibility to the side etching (that is, a material having a low etching rate), a difference from the phase shift pattern formed in the hard mask film may be reduced. When a material having high susceptibility to the side etching (that is, a material having a high etching rate) is selected for the upper layer, an amount of side etching may be reduced at the stage of having patterned the upper layer by the dry etching. However, when the layers other than the upper layer of the light shielding film are etched subsequently, the side etching in the side wall of the pattern in the upper layer proceeds significantly, and this is not preferred.

Meanwhile, since the layers other than the upper layer of the light shielding film are formed of the material having the high etching rate with respect to the chlorine-based gas containing oxygen, etching time required to pattern the layers other than the upper layer of the light shielding film may be reduced, and time required to perform the over etching for raising the side wall of the light shielding film may also be reduced. As a result, it is possible to reduce an amount of the side etching of the upper layer in the light shielding film while the layers other than the upper layer of the light shielding film are dry-etched.

When the light shielding film has such structure, the side wall of the pattern of the light shielding film, which is formed by the dry etching using the chlorine-based gas containing oxygen, tends to have a cross-sectional shape in which the upper layer side has low susceptibility to side etching, whereas the side etching of the layers other than the upper layer has proceeded. However, the light shielding film formed on the phase shift film, even with such cross-sectional shape having verticality that is not high, sufficiently functions as a mask during the dry etching using the fluorine-based gas for forming the phase shift pattern in the phase shift film.

In the dry etching of the phase shift film using as a mask the light shielding film having the phase shift pattern, the etching of the phase shift film does not necessarily proceed along the side wall surface of the pattern near the lower surface of the light shielding film, which is in contact with the phase shift film. To the dry etching of the phase shift film, the fluorine-based gas, which is an etching gas having a high tendency toward the anisotropy etching, is applied. Further, in the dry etching of the phase shift film using the fluorine-based gas, a bias voltage is usually applied on the back side of the transparent substrate to actively pull in the plasma of the fluorine-based gas. Therefore, the verticality of the etching using the etching gas is further increased. In the dry etching of the phase shift film, a portion that projects the most of the side wall of the pattern of the light shielding film (portion least susceptible to the side etching during the etching of the light shielding film, that is, the upper layer of the light shielding film in this case) inhibits the etching gas from making contact with the phase shift film. Further, the etching gas that has passed through a space without the light shielding film is pulled in by the bias voltage, and hence makes contact with the phase shift film while hardly spreading in a direction on the side wall side near the lower surface, where the side etching has proceeded, of the light shielding film to etch the phase shift film.

As described above, the material having the low etching rate (material having a high content of chromium) with respect to the dry etching using the chlorine-based gas containing oxygen has been applied to the upper layer of the light shielding film, and the material having the high etching rate (material having a low content of chromium) with respect to the dry etching using the chlorine-based gas containing oxygen has been applied to the layers other than the upper layer of the light shielding film to satisfy light shielding performance required of the light shielding film with a relatively small thickness. At the same time, the light shielding film has been able to have a function of transferring the phase shift pattern, which is formed in the hard mask film, on the phase shift film with a smaller difference.

However, it has been found that, when the light shielding film made of the chromium-based material having the above-mentioned laminated structure is dry-etched using the chlorine-based gas containing oxygen and using as a mask a hard mask film having a phase shift pattern containing an SRAF pattern having a pattern dimension of 50 nm or less, a part of the phase shift pattern formed in the light shielding film may suffer collapse of the pattern.

When the light shielding film, in which the material having the low content of chromium is applied to the layers other than the upper layer as described above, is dry-etched to form the pattern, side walls on both sides of the pattern of the light shielding film tend to have cross-sectional shapes that are hollowed inward from the upper layer side toward the phase shift film side. In other words, a contact area between the lower surface of the pattern of the light shielding film and the front surface of the phase shift film tends to be reduced. This phenomenon is particularly significant with the SRAF pattern in which a line width of the pattern is thin. However, when the content of chromium of the entirety of the layers other than the upper layer of the light shielding film is increased to suppress hollowing of the cross section of the pattern, the etching rate of the entire light shielding film is reduced, and a reduction in CD uniformity in the plane occurs.

The inventors of this invention have further conducted an intense research on the preferred structure of the light shielding film in such mask blank. As a result, the inventors have come to the conclusion that it is preferred that the light shielding film have the following three-layer structure: the upper layer, the intermediate layer, and the lower layer, and that the respective layers have the following characteristics with respect to the dry etching using the chlorine-based gas containing oxygen: the upper layer has the lowest etching rate, the intermediate layer has the highest etching rate, and the lower layer has an etching rate that is higher than that of the upper layer and lower than that of the intermediate layer. As a result of further consideration on the light shielding film having such characteristics, the inventors have devised the mask blank according to this invention. More specifically, the mask blank according to this invention has a configuration in which a light shielding film formed of a material containing chromium has the following three-layer structure: a lower layer, an intermediate layer, and an upper layer, and in which the upper layer has the highest content of chromium in the light shielding film, and the intermediate layer has the lowest content of chromium in the light shielding film and contains at least one metallic element selected from indium, tin, and molybdenum (those metallic elements are hereinafter referred to as "indium and other such metallic elements").

The upper layer of the light shielding film may have the highest content of chromium as described above to reduce an amount of side etching of the upper layer. As a result, a difference in pattern shape between the phase shift pattern formed in the upper layer of the light shielding film and the phase shift pattern formed in the hard mask film may be reduced. Moreover, the intermediate layer of the light shielding film may have the lowest content of chromium and have indium and other such metallic elements added thereto to increase the etching rate while suppressing a reduction in optical density (extinction coefficient k) of the intermediate layer. Then, the lower layer of the light shielding film may have the content of chromium that is higher than that of the intermediate layer to reduce the side etching in the lower portion of the pattern of the light shielding film and to avoid collapse of the pattern.

Another mask blank according to this invention has a configuration in which a light shielding film formed of a material containing chromium has the following two-layer structure: a lower layer and an upper layer, and in which the upper layer has a content of chromium that is higher than that of the lower layer, and the lower layer has a graded composition in which a content of chromium becomes lower from a phase shift film side toward the upper layer side and in which the lower layer contains at least one metallic element selected from indium, tin, and molybdenum (indium and other such metallic elements) on the upper layer side thereof.

This structure may also reduce the amount of side etching of the upper layer. Moreover, the lower layer of the light shielding film may have the graded composition in which the content of chromium becomes lower from the phase shift film side toward the upper layer side to reduce the side etching in the lower portion of the pattern of the light shielding film and to avoid the collapse of the pattern. Further, indium and other such metallic elements may be added to the lower layer of the light shielding film on the upper layer side to increase the etching rate while suppressing the reduction in optical density (extinction coefficient k) in an intermediate portion (upper layer side of the lower layer) in a film thickness direction of the light shielding film.

The detailed configuration of the present invention described above is now described with reference to the drawings. The same reference symbols are given to like components in each of the drawings.

<<Mask Blank According to First Embodiment>>

FIG. 1 is a cross-sectional view of a main part of a mask blank 1 according to a first embodiment of this invention. As illustrated in the figure, the mask blank 1 has the structure in which, on a main surface S, which is one side of a transparent substrate 10, a phase shift film 11, a light shielding film 13, and a hard mask film 15 are laminated in the stated order from a side of the transparent substrate 10, namely, a transparent substrate 10 side. Of the structure, the light shielding film 13 has the structure in which the following three layers: a lower layer 13a, an intermediate layer 13b, and an upper layer 13c are laminated in the stated order from a side of the phase shift film 11, namely, a phase shift film 11 side. Moreover, the mask blank 1 may have the structure in which a resist film 17 is laminated on the hard mask film 15 as necessary. Details of main constituent parts of the mask blank 1 are hereinafter described.

<Transparent Substrate 10>

The transparent substrate 10 is made of a material having a good transparency with respect to exposure light used in an exposure step of lithography. When an ArF excimer laser light (wavelength: about 193 nm) is used as the exposure light, the transparent substrate 10 may be made of a material having permeability with respect to the ArF excimer laser light. As such material, synthetic quartz glass is used, but instead, other various glass substrates may be used, such as aluminosilicate glass, soda-lime glass, and low thermal expansion glass (such as $SiO_2$—$TiO_2$ glass). In particular, a quartz substrate has high transparency in a region of the ArF excimer laser light or lower wavelength, and hence may be used particularly preferably in the mask blank according to this invention.

The "exposure step of the lithography" as used herein refers to an exposure step of lithography using the phase shift mask produced using the mask blank 1, and the "exposure light" hereinafter means exposure light used in the exposure step. As the exposure light, any one of an ArF excimer laser light (wavelength: 193 nm), a KrF excimer laser light (wavelength: 248 nm), or an i-line light (wavelength: 365 nm) may be applied, but in view of miniaturizing the phase shift pattern in the exposure step, it is desired to apply the ArF excimer laser light to the exposure light. Therefore, embodiments in a case where the ArF excimer laser light is applied to the exposure light are described below.

<Phase Shift Film 11>

The phase shift film 11 is a film having a predetermined transmittance with respect to the exposure light used in exposure and transfer steps, and having optical characteristics in which exposure light that has passed through the phase shift film and exposure light that has passed through air by the same distance as a thickness of the phase shift film have a predetermined phase difference.

Such phase shift film 11 is formed of a material containing silicon (Si) in this example. Moreover, it is preferred that the phase shift film 11 be formed of a material containing nitrogen (N) in addition to silicon. Such phase shift film 11 is capable of being patterned by dry etching using a fluorine-based gas, and is capable of being patterned with sufficient etching selectivity with respect to the light shielding film 13, which is formed of a material containing chromium (Cr) and is to be described below.

Moreover, as long as being capable of being patterned by the dry etching using the fluorine-based gas, the phase shift film 11 may further contain at least one element selected from metalloid elements, non-metallic elements, and metallic elements.

Among others, the metalloid elements may be any kind of metalloid element in addition to silicon. The non-metallic elements may be any kind of non-metallic element in addition to nitrogen, and it is preferred that one or more elements selected from, for example, oxygen (O), carbon (C), fluorine (F), and hydrogen (H) be contained therein. The metallic elements are exemplified by molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), tin (Sn), boron (B), and germanium (Ge).

Such phase shift film 11 is made of MoSiN, for example. The phase shift film 11 has a refractive index n, an extinction coefficient k, and a film thickness respectively selected so as to satisfy a predetermined phase difference (for example, 150 [deg] to 180 [deg]) and a predetermined transmittance (for example, 1% to 30%) with respect to the exposure light (for example, ArF excimer laser light). Further, the phase shift film 11 has a composition of film materials and film forming conditions of the film adjusted so as to have the refractive index n and the extinction coefficient k.

<Light Shielding Film 13>

The light shielding film 13 is a film having an optical density (OD) that is a predetermined value or more with respect to the exposure light used in the exposure and transfer steps to shield light so that, when the resist film on a semiconductor substrate is subjected to exposure and transfer using an exposure apparatus, the resist film is not affected by leaked light of the exposure light. Moreover, there is a need to apply, to the light shielding film 13, a material having sufficient etching selectivity with respect to the etching gas (fluorine-based gas) used in forming the phase shift pattern in the phase shift film 11. The optical density (OD) of the light shielding film 13 may take any value as long as a combined optical density (OD) of the phase shift film 11 and the light shielding film 13 is a predetermined value or more. For example, the optical density (OD) is preferably 3.0 or more, and is at least 2.8 or more.

Such light shielding film 13 in this example is formed of a material containing chromium (Cr), and has the structure in which the following three layers: a lower layer 13a, an intermediate layer 13b, and an upper layer 13c, which have different contents of chromium (Cr), are laminated. More specifically, the contents of chromium (Cr) in the light shielding film 13 are set so that the contents of chromium are decreased in the following order the upper layer 13c, the lower layer 13a, and the intermediate layer 13b. Examples of the material containing chromium, which forms the light shielding film 13 include, in addition to chrome metal, a material containing at least one element selected from oxygen, nitrogen, carbon, boron, hydrogen, and fluorine in chromium.

For the purpose of suppressing a reduction in etching rate of the entire film while maintaining the optical density (OD), the light shielding film 13 further contains at least one metallic element (indium and other such metallic elements) selected from indium (In), tin (Sn), and molybdenum (Mo).

Indium and other such metallic elements are mainly contained in the intermediate layer 13b. The light shielding film 13 preferably has a content of silicon (Si) of 10 at % or less, more preferably has a content of silicon (Si) of 5 at % or less, and particularly preferably contains no silicon (Si). This is because when the content of silicon in the light shielding film 13 becomes higher, the etching rate using the chlorine-based gas containing oxygen is significantly reduced.

Such light shielding film 13 is capable of being patterned by dry etching using the chlorine-based gas containing oxygen. Moreover, the light shielding film 13 has sufficient etching selectivity with respect to the phase shift film 11, which is formed of a material containing silicon (Si), and the light shielding film 13 may be removed by the etching while hardly damaging the phase shift film 11. The light shielding film 13 has sufficient etching selectivity with respect to the hard mask film 15, which is formed of a material containing silicon (Si) and is to be described below, and the light shielding film 13 is capable of being pattered using the hard mask film 15 as a mask.

In view of the above-mentioned circumstances, the lower layer 13a, the intermediate layer 13b, and the upper layer 13c, which form the light shielding film 13, have the following configurations, respectively.

The lower layer 13a is a layer provided closest to the phase shift film 11. Such lower layer 13a has a content of chromium that is higher than that of the intermediate layer 13b. In this manner, when the light shielding film 13 is subjected to pattern etching by the dry etching using the chlorine-based gas containing oxygen to form a light shielding film pattern, the etching rate of the lower layer 13a of the light shielding film 13 may be made smaller than the etching rate of the intermediate layer 13b. As a result, even when the dry etching using the chlorine-based gas containing oxygen, which has a higher tendency toward isotropic etching, is performed on the light shielding film 13, the side etching in the lower layer 13a of the light shielding film 13 may be reduced, and the collapse of the pattern of the light shielding film 13 may be suppressed.

The lower layer 13a is required to have a content of chromium of 35 at % or more, preferably 40 at % or more, and more preferably 45 at % or more. The lower layer 13a is also required to have the content of chromium of 55 at % or less, and preferably 50 at % or less.

In addition, the lower layer 13a may contain indium and other such metallic elements in addition to the material containing chromium. However, the lower layer 13a contains indium and other such metallic elements, if any, in an amount that is smaller than that in the intermediate layer 13b, and may contain no indium and other such metallic elements. The lower layer 13a contains no indium and other such metallic elements (indium and other such metallic elements are included by contamination or the like in an allowable content, and the lower layer 13a is allowed to have a content of indium and other such metallic elements in a range of 1 at % or less, for example) so that the lower layer 13a may be formed with the composition being satisfactorily controlled.

The lower layer 13a is required to have a thickness of 20 nm or less, preferably 18 nm or less, and more preferably 15 nm or less. This is because, when the thickness of the lower layer 13a is too thick, the etching rate of the light shielding film 13 as a whole with respect to the chlorine-based gas containing oxygen is disadvantageously reduced. The lower layer 13a is required to have the thickness of 3 nm or more, preferably 5 nm or more, and more preferably 7 nm or more. This is because, when the thickness of the lower layer 13a is too thin, it becomes difficult to reduce a difference in amount of side etching in the side wall of the pattern of the lower layer 13a in the plane, and to obtain the effect of suppressing the collapse of the pattern of the light shielding film 13.

The intermediate layer 13b is a layer having the lowest content of chromium (Cr) in the light shielding film 13, and containing at least one metallic element selected from indium, tin, and molybdenum (indium and other such metallic elements). Such intermediate layer 13b mainly has the structure in which the content of chromium (Cr) is suppressed, and in which indium and other such metallic elements are added, and hence is a layer for increasing the etching rate while suppressing the reduction in optical density (OD). The content of indium and other such metallic elements in such intermediate layer 13b is set in consideration of a total optical density (OD) of the light shielding film 13, but when the entire light shielding film 13 contains indium and other such metallic elements, the intermediate layer 13b has a content of indium and other such metallic elements that is higher than those of the lower layer 13a and the upper layer 13c.

The intermediate layer 13b is required to have a ratio M/(M+Cr) [%] of a total content M [at %] of indium and other such metallic elements to a total content (Cr+M) [at %] of chromium and indium and other such metallic elements of 5% or more, preferably 7% or more, and more preferably 10% or more. This is because the etching rate with respect to the dry etching using the chlorine-based gas containing oxygen is improved. Meanwhile, the intermediate layer 13b is required to have M/(M+Cr) [%] of 50% or less, preferably 30% or less, and more preferably 20% or less. This is because indium and other such metallic elements M are less resistant to chemical cleaning or cleaning with hot water than chromium.

The intermediate layer 13b is required to have a content of chromium of 25 at % or more, preferably 30 at % or more, and more preferably 35 at % or more. The intermediate layer 13b is also required to have the content of chromium of 50 at % or less, preferably 45 at % or less, and more preferably 40 at % or less.

The intermediate layer 13b is required to have a thickness of 35 nm or less, preferably 30 nm or less, and more preferably 25 nm or less. The intermediate layer 13b is required to have the thickness of 10 nm or more, preferably 15 nm or more, and more preferably 20 nm or more.

The upper layer 13c is a layer forming a top layer of the light shielding film 13, and is mainly used as a layer for determining an etching shape when the phase shift film 11 thereunder is subjected to the pattern etching. Such upper layer 13c has the highest content of chromium in the light shielding film 13, and is required to have a density of chromium of 60 at % or more, preferably 65 at % or more, and more preferably 70 at % or more. Moreover, the upper layer 13c has the content of chromium of preferably 90 at % or less, and more preferably 80 at % or less. This is because, when the content of chromium of the upper layer 13c is too high, the etching rate with respect to the chlorine-based gas containing oxygen is significantly reduced, and a load on the hard mask film 15 having the phase shift pattern, which serves as the etching mask, is increased.

As described above, the upper layer 13c has the highest content of chromium in the light shielding film 13 so that, when the light shielding film 13 is subjected to pattern etching by the dry etching using the chlorine-based gas containing oxygen to form the light shielding film patter, the etching rate of the upper layer 13c of the light shielding film 13 may be suppressed to the lowest level in the light shielding film 13. As a result, even when an oxygen gas is used as the etching gas in subjecting the light shielding film 13 to the pattern etching to form the light shielding film patter, and isotropy etching proceeds as a result, the isotropy etching of the upper layer 13c in the light shielding film 13 may be suppressed to the smallest level, and a shape in plan view of the light shielding film pattern may be maintained satisfactorily.

The upper layer 13c may contain indium and other such metallic elements in addition to the material containing chromium. However, the upper layer 13c contains indium and other such metallic elements, if any, in an amount that is smaller than that in the intermediate layer 13b, and may contain no indium and other such metallic elements. The upper layer 13c contains no indium and other such metallic elements (indium and other such metallic elements are included by contamination or the like in an allowable content, and the upper layer 13c is allowed to have a content of indium and other such metallic elements in a range of 1 at % or less, for example) so that the upper layer 13c may be formed with the composition being satisfactorily controlled.

In addition, such upper layer 13c is required to have a film thickness of 3 nm or more, and preferably 5 nm or more. The upper layer 13c is also required to have the film thickness of 8 nm or less, and preferably 5 nm or more. In this manner, in the pattern etching of the phase shift film 11 using as a mask the pattern of the light shielding film including the upper layer 13c, the shape of the pattern of the upper layer 13c may be transferred to the phase shift film 11 with high accuracy.

<Hard Mask Film 15>

The hard mask film 15 is a film formed of a material having etching resistance to the etching gas used when the light shielding film 13 is etched. The hard mask film 15 only needs to have a film thickness that is enough to be able to function as an etching mask until the dry etching for forming the pattern in the light shielding film 13 is finished, and basically is not constrained by the optical characteristics. Therefore, the thickness of the hard mask film 15 may be significantly reduced as compared to the thickness of the light shielding film 13.

The hard mask film 15 is required to have a thickness of 15 nm or less, preferably 10 nm or less, and more preferably 8 nm or less. This is because, when the thickness of the hard mask film 15 is too thick, the resist film, which is used as a mask in the dry etching for forming the phase shift pattern in the hard mask film 15, needs to be thick. The hard mask film 15 is required to have the thickness of 3 nm or more, and preferably 5 nm or more. This is because, when the thickness of the hard mask film 15 is too thin, there is a fear that the pattern of the hard mask film 15 may disappear before the dry etching for forming the phase shift pattern in the light shielding film 13 is finished depending on etching conditions (such as high-bias etching).

In addition, the resist film 17, which is made of an organic-based material and used as the etching mask in the dry etching for forming the pattern in the hard mask film 15, only needs to have a film thickness that is enough to function as the etching mask until the dry etching of the hard mask film 15 is finished. Therefore, as a result of providing the hard mask film 15, the thickness of the resist film 17 may be made thinner than that of the related-art structure without the hard mask film 15.

A material containing silicon (Si) or a material containing tantalum (Ta) can be used as such hard mask film 15. An example of the material containing silicon (Si), which is suitable for the hard mask film 15, is a material containing silicon (Si) and one or more elements selected from oxygen (O), nitrogen (N), carbon (C), boron (B), and hydrogen (H). Another example of the material containing silicon (Si), which is suitable for the hard mask film 15, is a material containing silicon (Si), a transition metal, and one or more elements selected from oxygen (O), nitrogen (N), carbon (C), boron (B), and hydrogen (H). In addition, examples of the transition metal include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), and tin (Sn).

Meanwhile, an example of the material containing tantalum (Ta), which is suitable for hard mask film 15, is a material containing tantalum (Ta) and one or more elements selected from oxygen (O), nitrogen (N), carbon (C), boron (B), and hydrogen (H). Of those, a material containing tantalum (Ta) and oxygen (O) is particularly preferred. Specific examples of such material include tantalum oxide (TaO), tantalum oxynitride (TaON), tantalum borate (TaBO), and tantalum boron oxynitride (TaBON).

Moreover, it is preferred that the hard mask film 15 be formed of a material containing oxygen (O) in addition to silicon (Si). Such hard mask film 15 has sufficient etching selectivity with respect to the light shielding film 13, which is formed of a material containing chromium (Cr), and the hard mask film 15 may be removed by etching while hardly damaging the light shielding film 13.

Specific examples of the material forming such hard mask film 15 include silicon oxide ($SiO_2$), silicon nitride (SiN), and silicon oxynitride (SiON). The hard mask film 15 tends to be low in adhesion with the resist film made of the organic-based material, and hence it is preferred to perform hexamethyldisilazane (HMDS) processing on a front surface of the hard mask film 15 to improve the adhesion of the front surface.

<Resist Film 17>

In the mask blank 1 according to this invention, it is preferred that the resist film 17 made of the organic-based material be formed to have a film thickness of 100 nm or less in contact with the front surface of the hard mask film 15. In the case of a fine pattern compatible with the DRAM hp 32 nm generation, a sub-resolution assist feature (SRAF) having a line width of 40 nm may be provided in the phase shift pattern that is to be formed in the hard mask film 15. However, also in this case, as described above, as a result of providing the hard mask film 15, the film thickness of the resist film 17 may be suppressed, and as a consequence, a cross-sectional aspect ratio of the resist pattern formed of the resist film 17 may be set as low as 1:2.5. Therefore, collapse or detachment of the resist pattern during the development, rinsing, and the like of the resist film 17 may be suppressed. It is more preferred that the resist film 17 have the film thickness of 80 nm or less.

<Procedure of Manufacturing Mask Blank 1>

The mask blank 1 having the above-mentioned structure is produced through the following procedure. First, the transparent substrate 10 is prepared. The transparent substrate 10 is a substrate having its end surfaces and main surface S polished to a predetermined surface roughness, and then being subjected to predetermined cleaning processing and drying processing.

Next, on the transparent substrate 10, the phase shift film 11 is formed by a sputtering method. After the phase shift film 11 is formed, annealing at a predetermined heating temperature is performed as post treatment. Thereafter, on the phase shift film 11, the lower layer 13a, the intermediate layer 13b, and the upper layer 13c of the light shielding film 13 are formed in the stated order by the sputtering method, and then the hard mask film 15 is formed by the sputtering method. In the film formation of each layer by the sputtering method, sputtering targets containing materials forming each layer in a predetermined composition ratio and a sputtering gas are used, and further, film formation using an inert gas, such as argon (Ar), helium (He), or the like, as a sputtering gas is performed.

Thereafter, when the mask blank 1 includes the resist film 17, the HMDS processing is performed on the front surface of the hard mask film 15. Then, on the front surface, which has been subjected to the HMDS processing, of the hard mask film 15, the resist film 17 is formed by an application method, such as spin coating, to complete the mask blank 1.

<<Mask Blank According to Second Embodiment>>

Figure 2:
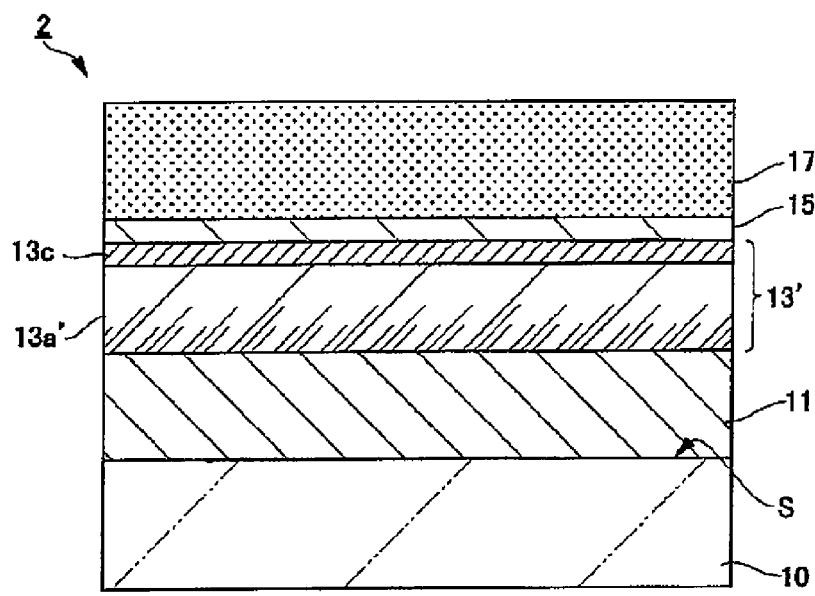
FIG. 2 is a cross-sectional view for illustrating the structure of a mask blank according to a second embodiment of this invention.

FIG. 2 is a cross-sectional view of a main part of a mask blank 2 according to a second embodiment of this invention. The mask blank 2 illustrated in this figure is different from the mask blank according to the first embodiment in the structure of a light shielding film 13', and is similar to the first embodiment in the other structures. Therefore, only the structure of the light shielding film 13' is described here, and a duplicate description is omitted.

<Light Shielding Film 13'>

The light shielding film 13' in the mask blank 2 according to the second embodiment is different from the light shielding film in the mask blank according to the first embodiment in that, while the light shielding film in the first embodiment has the three-layer structure, the light shielding film 13' in the second embodiment has the following two-layer structure: a lower layer 13a' and an upper layer 13c, and is similar to the first embodiment in the optical density (OD) and the other structures. As with the light shielding film in the first embodiment, such light shielding film 13' having the two-layer laminated structure is formed of a material containing chromium (Cr), and further contains at least one metallic element selected from indium (In), tin (Sn), and molybdenum (Mo) (indium and other such metallic elements).

Of the structure, the lower layer 13a' has a graded composition so that a content of chromium (Cr) becomes lower from the phase shift film 11 side to the upper layer 13c side.

In the lower layer 13a', the content of chromium (Cr) in a region on the phase shift film 11 side thereof is the highest in the lower layer 13a'. In this manner, when the light shielding film 13' is subjected to pattern etching by the dry etching using the chlorine-based gas containing oxygen to form a light shielding film pattern, the etching rate of the region on the phase shift film 11 side of the lower layer 13a' may be made smaller than the etching rate of a region other than that region (region on the upper layer 13c side) of the lower layer 13a'. As a result, even when the dry etching using the chlorine-based gas containing oxygen, which has a higher tendency toward isotropic etching, is performed on the light shielding film 13', the side etching in the region on the phase shift film 11 side of the lower layer 13a' of the light shielding film 13' may be reduced, and the collapse of the pattern of the light shielding film 13' may be suppressed.

The region on the phase shift film 11 side of the lower layer 13a' is required to have a content of chromium of 35 at % or more, preferably 40 at % or more, and more preferably 45 at % or more. The region on the phase shift film 11 side of the lower layer 13a' is also required to have the content of chromium of 55 at % or less, and preferably 50 at % or less.

In addition, the region on the phase shift film 11 side of the lower layer 13a' may contain indium and other such metallic elements. However, the region on the phase shift film 11 side of the lower layer 13a' contains indium and other such metallic elements, if any, in an amount that is smaller than that in the region on the upper layer 13c side of the lower layer 13a', and may contain no indium and other such metallic elements (the phrase "containing no indium and other such metallic elements" as used herein means that indium and other such metallic elements are included by contamination or the like in an allowable content, and that the region on the phase shift film 11 side of the lower layer 13a' is allowed to have a content of indium and other such metallic elements in a range of 1 at % or less, for example).

The region on the phase shift film 11 side of the lower layer 13a' is required to have a thickness of 20 nm or less, preferably 18 nm or less, and more preferably 15 nm or less. This is because, when the thickness of the region on the phase shift film 11 side of the lower layer 13a' is too thick, the etching rate of the light shielding film 13' as a whole with respect to the chlorine-based gas containing oxygen is disadvantageously reduced. The region on the phase shift film 11 side of the lower layer 13a' is required to have the thickness of 3 nm or more, preferably 5 nm or more, and more preferably 7 nm or more. This is because, when the thickness of the region on the phase shift film 11 side of the lower layer 13a' is too thin, it becomes difficult to reduce a difference in amount of side etching in the side wall of the pattern of the region on the phase shift film 11 side of the lower layer 13a' in the plane, and to obtain the effect of suppressing the collapse of the pattern of the light shielding film 13'.

The region on the upper layer 13c side of the lower layer 13a' has the lowest content of chromium (Cr) in the light shielding film 13', and contains at least one metallic element selected from indium, tin, and molybdenum (indium and other such metallic elements). As a result, the etching rate may be increased while suppressing the reduction in optical density (OD) of the entire light shielding film 13'. The content of indium and other such metallic elements in the region on the upper layer 13c side is set in consideration of a total optical density (OD) of the light shielding film 13', but when the entire light shielding film 13' contains indium and other such metallic elements, the region on the upper layer 13c side has the highest content of indium and other such metallic elements.

The region on the upper layer 13c side of the lower layer 13a' is required to have a ratio M/(M+Cr) [%] of a total content M [at %] of indium and other such metallic elements to a total content (Cr+M) [at %] of chromium and indium and other such metallic elements of 5% or more, preferably 7% or more, and more preferably 10% or more. This is because the etching rate with respect to the dry etching using the chlorine-based gas containing oxygen is improved. Meanwhile, the region on the upper layer 13c side of the lower layer 13a' is required to have M/(M+Cr) [%] of 50% or less, preferably 30% or less, and more preferably 20% or less. This is because indium and other such metallic elements M are less resistant to chemical cleaning or cleaning with hot water than chromium.

The region on the upper layer 13c side of the lower layer 13a' is required to have a content of chromium of 25 at % or more, preferably 30 at % or more, and more preferably 35 at % or more. The region on the upper layer 13c side of the lower layer 13a' is also required to have the content of chromium of 50 at % or less, preferably 45 at % or less, and more preferably 40 at % or less.

The region on the upper layer 13c side of the lower layer 13a' is required to have a thickness of 35 nm or less, preferably 30 nm or less, and more preferably 25 nm or less. The region on the upper layer 13c side of the lower layer 13a' is required to have the thickness of 10 nm or more, preferably 15 nm or more, and more preferably 20 nm or more.

The upper layer 13c has a structure that is similar to that in the first embodiment, and has the highest content of chromium in the light shielding film 13'. Such upper layer 13c is provided so that, as in the first embodiment, even when an oxygen gas is used as an etching gas in subjecting the light shielding film 13' to the pattern etching to form the light shielding film pattern, and isotropy etching proceeds as a result, the isotropy etching of the upper layer 13c in the light shielding film 13' may be suppressed to the smallest level, and a shape in plan view of the pattern of the light shielding film may be maintained satisfactorily with the upper layer 13c.

The upper layer 13c may contain indium and other such metallic elements in addition to the material containing chromium. However, similarly to the first embodiment, the upper layer 13c contains indium and other such metallic elements, if any, in an amount that is smaller than that in the intermediate layer 13b, and may contain no indium and other such metallic elements.

<Procedure of Manufacturing Mask Blank 2>

A procedure of manufacturing the mask blank 2 having the above-mentioned structure is similar to that in the first embodiment up to annealing of the phase shift film 11. Next, on the phase shift film 11, the lower layer 13a' is formed by a sputtering method. At this time, a film forming apparatus is controlled to obtain a graded composition film in which a content of indium and other such metallic elements in the region on the phase shift film 11 side of the lower layer 13a' is higher than a content of indium and other such metallic elements in the region on the upper layer 13c side. More specifically, first, on a rotary table in a sputtering chamber, in which the following two targets: a chromium target and a target containing indium and other such metallic elements (target formed only of indium and other such metallic elements or target formed of both elements of chromium and indium and other such elements) are disposed, the transparent substrate 10, on which the phase shift film 11 has been formed, is installed. Then, in the sputtering chamber, a film forming gas is introduced, and further, voltages are applied to both of the two targets to form the region on the phase shift film 11 side of the lower layer 13a' on the phase shift film 11 by sputtering.

In the film formation by the sputtering, from the start of the film formation of the region on the phase shift film 11 side in the lower layer 13a' to the end of the film formation of a front surface of the region on the upper layer 13c side in the lower layer 13a', the voltage applied to the target containing indium and other such metallic elements is gradually increased. In this manner, the lower layer 13a' may be a graded composition film in which the content of indium and other such metallic elements is increased from the phase shift film 11 side to the upper layer 13c side. Moreover, during the film formation of the lower layer 13a' by the sputtering, in the course of the film formation by the sputtering, an adjustment, such as changing flow rates of a rare gas and a reactive gas of the film forming gas, may be made. After the film formation of the lower layer 13a', each of the upper layer 13c and the hard mask film 15 is formed in a procedure similar to that in the first embodiment. Moreover, when the mask blank 2 includes a resist film 17, the resist film 17 is formed by application in a procedure similar to that in the first embodiment. Through the above-mentioned procedure, the mask blank 2 is produced.

<<Method of Manufacturing Phase Shift Mask, and Phase Shift Mask>>

A method of manufacturing a phase shift mask according to the present invention is a method of manufacturing a phase shift mask using the mask blank according to the first embodiment, which has been described with reference to FIG. 1, or a method of manufacturing a phase shift mask using the mask blank according to the second embodiment, which has been described with reference to FIG. 2.

Now, the method of manufacturing the phase shift mask is described with reference to FIG. 3A to FIG. 3D and FIG. 4A to FIG. 4C. In FIG. 3A to FIG. 3D and FIG. 4A to FIG. 4C, the mask blank according to the first embodiment, which has been described with reference to FIG. 1, is described, but the production method to be described with reference to FIG. 3A to FIG. 3D and FIG. 4A to FIG. 4C is equally applied to the case where the mask blank according to the second embodiment, which has been described with reference to FIG. 2, is used.

Figure 3A:
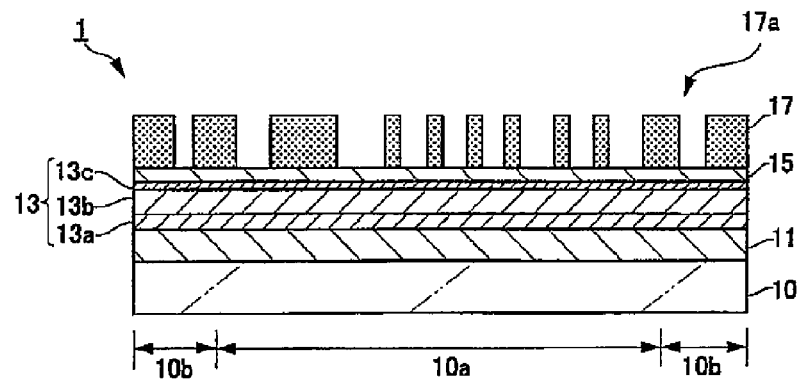
FIG. 3A is a view of one manufacturing step for illustrating a method of manufacturing a phase shift mask according to this invention.

First, as illustrated in FIG. 3A, on the resist film 17 of the mask blank 1, the phase shift pattern and an alignment mark pattern, which are to be formed in the phase shift film 11, are exposure-drawn. For the exposure drawing, an electron beam is often used. At this time, a center portion of the transparent substrate 10 is a phase shift pattern forming region 10a, in which a pattern corresponding to the phase shift pattern is exposure-drawn. Moreover, in a peripheral region 10b of the phase shift pattern forming region 10a, the phase shift pattern is not formed, and a pattern, such as an alignment mark, is exposure-drawn. Thereafter, the resist film 17 is subjected to predetermined processing, such as PEB processing, development processing, and post-baking processing, to form a first resist pattern 17a including the phase shift pattern and the alignment mark pattern.

Figure 3B:
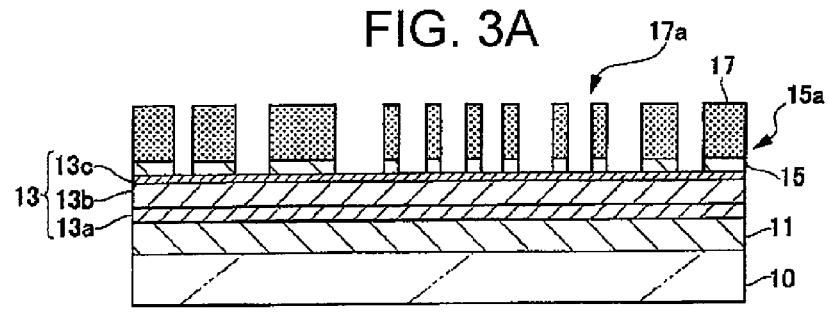
FIG. 3B is a view of one manufacturing step for illustrating the method of manufacturing a phase shift mask according to this invention.

Next, as illustrated in FIG. 3B, the hard mask film 15 is dry-etched using the fluorine-based gas and using the first resist pattern 17a as a mask to form a hard mask pattern 15a in the hard mask film 15. Thereafter, the first resist pattern 17a is removed. In this example, the light shielding film 13 may be dry-etched with the resist pattern 17a being left without being removed. Also in this case, in the course of the dry etching of the light shielding film 13, the resist pattern 17a disappears.

Figure 3C:
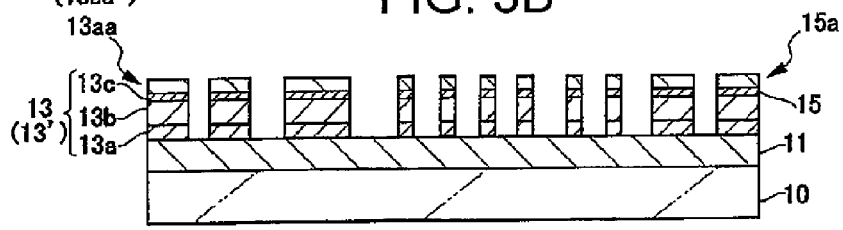
FIG. 3C is a view of one manufacturing step for illustrating the method of manufacturing a phase shift mask according to this invention.

Next, as illustrated in FIG. 3C, the light shielding film 13 is dry-etched using a mixture gas of a chlorine-based gas and an oxygen gas (chlorine-based gas containing oxygen) and using the hard mask pattern 15a as a mask to pattern the light shielding film 13 containing indium and other such metallic elements as well as chromium. In this manner, a light shielding film pattern 13aa is formed.

Figure 3D:
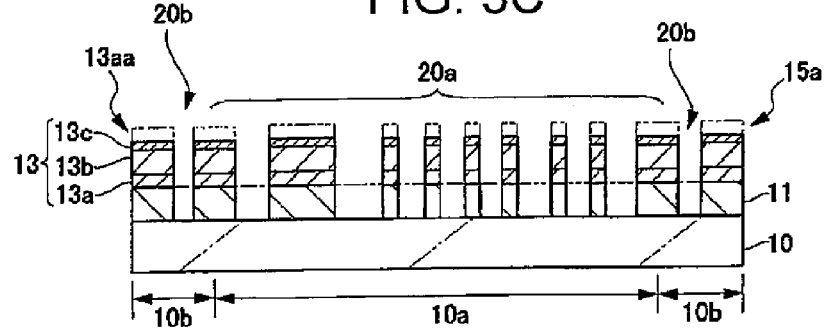
FIG. 3D is a view of one manufacturing step for illustrating the method of manufacturing a phase shift mask according to this invention.

Thereafter, as illustrated in FIG. 3D, the phase shift film 11 is dry-etched using the fluorine-based gas and using the light shielding film pattern 13aa as a mask to pattern the phase shift film 11, which is formed of a material containing silicon. In this manner, in the phase shift pattern forming region 10a of the transparent substrate 10, a phase shift pattern 20a, which is formed by patterning the phase shift film 11, is formed. Moreover, in the peripheral region 10b of the transparent substrate 10, a hole-shaped alignment mark pattern 20b, which pierces through the light shielding film 13 and the phase shift film 11, is formed. In the dry etching of such phase shift film 11, which is formed of the material containing silicon, the hard mask pattern 15a, which is formed of a material containing silicon, is also removed at the same time.

Figure 4A:
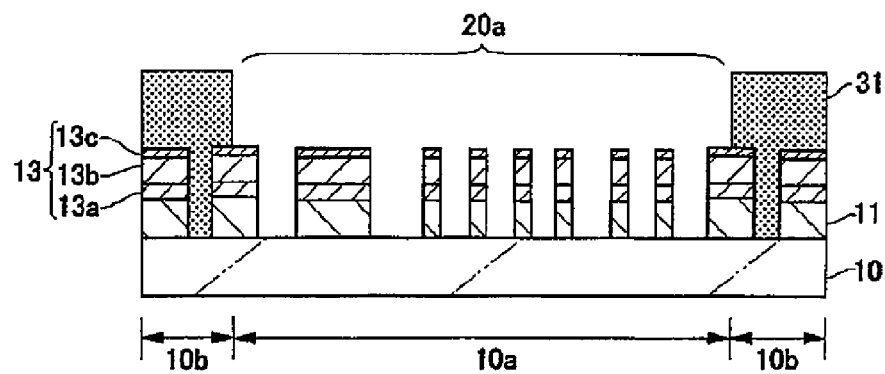
FIG. 4A is a view of one manufacturing step for illustrating the method of manufacturing a phase shift mask according to this invention.

Next, as illustrated in FIG. 4A, a second resist pattern 31 is formed to have a shape that covers the peripheral region 10b of the transparent substrate 10. At this time, the resist film is first formed by a spin coating method on the transparent substrate 10. Next, the resist film is exposed to light so that the resist film remains in the shape that covers the peripheral region 10b of the transparent substrate 10, and then the resist film is subjected to predetermined processing, such as development processing. In this manner, the second resist pattern 31 is formed to have the shape that covers the peripheral region 10b of the transparent substrate 10.

Figure 4B:
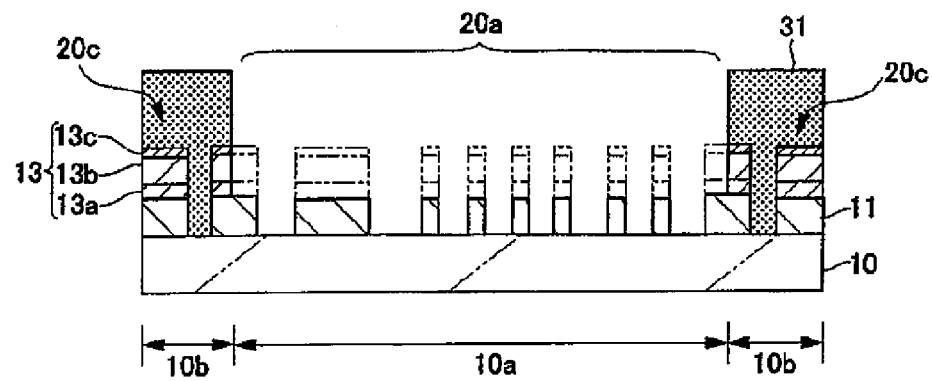
FIG. 4B is a view of one manufacturing step for illustrating the method of manufacturing a phase shift mask according to this invention.

Thereafter, as illustrated in FIG. 4B, the light shielding film 13 is dry-etched using the mixture gas of the chlorine-based gas and the oxygen gas and using the second resist pattern 31 as a mask to form a light shielding pattern 20c, which is formed by patterning the light shielding film 13 in a ring shape that covers the peripheral region 10b.

Figure 4C:
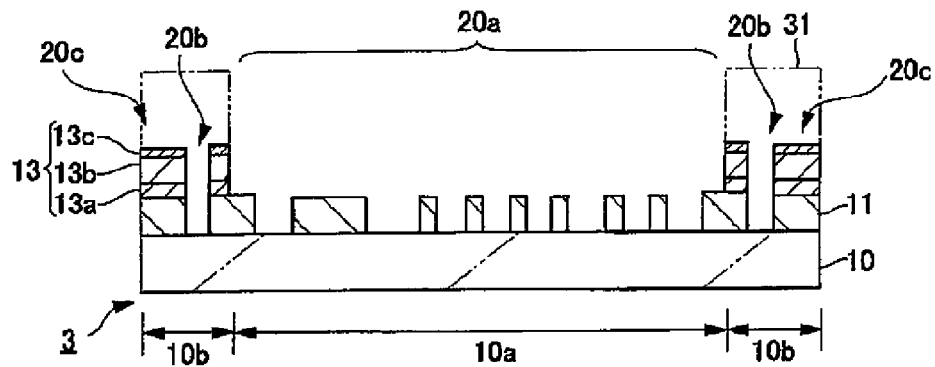
FIG. 4C is a view of one manufacturing step for illustrating the method of manufacturing a phase shift mask according to this invention.

Next, as illustrated in FIG. 4C, the second resist pattern 31 is removed, and predetermined processing, such as cleaning, is performed. Through the above procedure, a phase shift mask 3 is obtained.

The chlorine-based gas used in the dry etching in the above-mentioned production process is not particularly limited as long as Cl is contained. Examples of the chlorine-based gas include $Cl_2$, $SiCl_2$, $CHCl_3$, $CH_2Cl_2$, $CCl_4$, $BCl_3$, and the like. Moreover, as the fluorine-based gas used in the dry etching in the above-mentioned production process is not particularly limited as long as F is contained. Examples of the fluorine-based gas include $CHF_3$, $CF_4$, $C_2F_6$, $C_4F_8$, $SF_6$, and the like. In particular, the fluorine-based gas containing no C has a relatively low etching rate with respect to a glass substrate, and hence a damage on the glass substrate may be further reduced.

The thus-obtained phase shift mask 3 has the structure in which, when the mask blank 1 according to the first embodiment, which has been described with reference to FIG. 1, is used, the phase shift film 11 in which the phase shift pattern 20a is formed, and the light shielding film 13 in which the light shielding pattern 20c is formed are laminated on the transparent substrate 10 in the stated order from the transparent substrate 10 side. A portion in which the phase shift film 11 and the light shielding film 13 are laminated has the hole-shaped alignment mark pattern 20b, which pierces through the phase shift film 11 and the light shielding film 13.

Of the structure, the phase shift pattern 20a is formed in the phase shift pattern forming region 10a, which is set in the center portion of the transparent substrate 10. Moreover, the light shielding pattern 20c is formed in the peripheral region 10b, which surrounds the phase shift pattern forming region 10a, to have a ring shape that surrounds the phase shift pattern forming region 10a. In addition, the alignment mark pattern 20b is formed in the peripheral region 10b.

When the mask blank 2 according to the second embodiment, which has been described with reference to FIG. 2, is used, there is obtained a phase shift mask having the structure in which the light shielding film 13 illustrated in FIG. 4C is replaced by the light shielding film 13', which has been described with reference to FIG. 2.

In the method of manufacturing the phase shift mask, which has been described above, the phase shift mask is produced using the mask blank 1 according to the first embodiment. Therefore, in the step of dry-etching the light shielding film 13, which has been described with reference to FIG. 3C, the chlorine-based gas containing oxygen, which has a high tendency toward the isotropy etching, is used as the etching gas, with the result that the side etching proceeds. However, the upper layer 13c of the light shielding film 13 has the highest chromium density in the light shielding film 13, and hence the proceeding of the side etching may be suppressed to the smallest level. Further, a divergence from a pattern shape of the hard mask pattern 15a thereabove is small, and a shape in plan view of the light shielding film patter 13aa may be maintained satisfactorily with the upper layer 13c.

In addition, the intermediate layer 13b has the lowest content of chromium (Cr) in the light shielding film 13. As a result, although the side etching proceeds easily, the etching rate may be increased, and etching time of the entire light shielding film 13 may be reduced. In addition, the intermediate layer 13b contains indium and other such metallic elements, and hence the optical density (OD) of the entire light shielding film 13 is maintained.

Moreover, the lower layer 13a has a content of chromium (Cr) that is higher than that of the intermediate layer 13b, and hence has an etching rate that is lower than that of the intermediate layer 13b, with the result that the side etching may be suppressed to a small level. As a result, the side etching in a bottom layer of the light shielding film 13 may be reduced to suppress the collapse of the pattern of the light shielding film pattern 13aa.

Moreover, in the etching of the phase shift film 11 using as a mask the light shielding film pattern 13aa which has been pattered as described above, the upper layer 13c of the light shielding film 13, which has been formed to have a satisfactory planar shape, may serve as a mask to pattern the phase shift film 11 with a small divergence from the pattern shape of the hard mask pattern 15a.

Also in production of a phase shift mask using the mask blank 2 according to the second embodiment, when the dry etching step described with reference to FIG. 3C is applied to the light shielding film 13' in a similar manner, the chlorine-based gas containing oxygen, which has the high tendency toward the isotropy etching, is used as the etching gas, with the result that the side etching proceeds. However, the upper layer 13c of the light shielding film 13' has the highest chromium density in the light shielding film 13, and hence the proceeding of the side etching may be suppressed to the smallest level. Further, a divergence from a pattern shape of the hard mask pattern 15a thereabove is small, and a shape in plan view of a light shielding film pattern 13aa' may be maintained satisfactorily with the upper layer 13c.

In addition, the region on the upper layer 13c side of the lower layer 13a' has the lowest content of chromium (Cr) in the light shielding film 13. As a result, although the side etching proceeds easily, the etching rate may be increased, and etching time of the entire light shielding film 13' may be reduced. In addition, the region on the upper layer 13c side contains indium and other such metallic elements, and hence the optical density (OD) of the entire light shielding film 13' is maintained.

Moreover, the region on the phase shift film 11 side of the lower layer 13a' has a content of chromium (Cr) that is higher than that of the region on the upper layer 13c side, and hence has a low etching rate, with the result that the side etching may be suppressed to a small level. As a result, the side etching in the bottom layer of the light shielding film 13' may be reduced to suppress the collapse of the pattern of the light shielding film pattern 13aa'.

Moreover, in the etching of the phase shift film 11 using as a mask the light shielding film pattern 13aa' which has been patterned as described above, the upper layer 13c of the light shielding film 13', which has been formed to have a satisfactory shape in plan view, may serve as a mask to pattern the phase shift film 11 with a small divergence from the pattern shape of the hard mask pattern 15a.

<<Method of Manufacturing Semiconductor Device>>

A method of manufacturing a semiconductor device according to this invention has a feature that a transfer pattern (phase shift patter) of a phase shift mask is transferred by exposure on the resist film on the substrate using the phase shift mask, or the phase shift mask produced by the method of manufacturing the phase shift mask, which has been described above. Such method of manufacturing the semiconductor device is performed as follows.

First, a substrate, on which the semiconductor device is to be formed, is prepared. This substrate may be a semiconductor substrate or a substrate with a semiconductor thin film, or the semiconductor substrate or the substrate with the semiconductor film on which a finely processed film is further formed, for example. A resist film is formed on the prepared substrate, and the resist film is subjected to patterning and exposure using the phase shift mask according to this invention so that a transfer pattern, which is formed in the phase shift mask, is transferred by exposure on the resist film. At this time, exposure light compatible with the phase shift film forming the transfer pattern is used as exposure light, and in this example, an ArF excimer laser light is used, for example.

Thereafter, the resist film, on which the transfer pattern has been transferred by the exposure, is subjected to development processing to form a resist pattern, and processing of performing etching processing on and introducing impurities to a surface layer of the substrate is performed using the resist pattern as a mask. After the processing is ended, the resist pattern is removed.

The processing as described above is repeatedly performed on the substrate while replacing transfer masks, and necessary processing is further performed to complete the semiconductor device.

In the production of the semiconductor device as described above, the phase shift mask, or the phase shift mask in which the phase shift pattern has good form accuracy and which has been produced by the method of manufacturing the phase shift mask according to this invention can be used to form a resist pattern having an accuracy that sufficiently satisfies initial design specifications on the substrate. As a result, when a lower film is dry-etched using the pattern of the resist film as a mask to form a circuit pattern, a highly accurate circuit pattern can be formed without short-circuit or disconnection of wirings, which is attributed to inadequate accuracy.

EXAMPLES

Now, the embodiments of this invention are described more specifically by means of Examples.

Example 1

[Production of Mask Blank]

The mask blank 1 according to the first embodiment, which has been described with reference to FIG. 1, was produced as follows. First, a transparent substrate 10, which was made of synthetic quartz glass having dimensions of a main surface of about 152 mm by about 152 mm and a thickness of about 6.25 mm, was prepared. The transparent substrate 10 was a substrate having its end surfaces and main surface S polished to a predetermined surface roughness, and then being subjected to predetermined cleaning processing and drying processing.

Next, under the conditions provided in Table 1 below, the phase shift film 11, the lower layer 13a of the light shielding film 13, the intermediate layer 13b of the light shielding film 13, the upper layer 13c of the light shielding film 13, and the hard mask film 15 were formed in the stated order on the transparent substrate 10. For the film formation by the sputtering, a sheet-type film forming apparatus using a DC sputtering method was used.

TABLE 1

| | | Composition (at % ratio:XPS) | Film thickness (nm) | Target (at % ratio) | Sputtering gas |
|---|---|---|---|---|---|
| Phase shift film 11 | | MoSiN (Mo:Si:N = 4:36:60) | 69 | Mo + Si (Mo:Si = 12:8) | Mixture gas of Ar, $N_2$, and He |
| Light shielding film 13 | Lower layer 13a | CrOCN (Cr:O:C:N = 55:22:12:11) | 16 | Cr | Mixture gas of Ar, He, $N_2$, and $CO_2$ |
| | Intermediate layer 13b | CrInOCN (Cr:In:O:C:N = 46:4:28:8:14) | 24 | Cr + In (Cr:In = 90:10) | Mixture gas of Ar, He, $N_2$, and $CO_2$ |
| | Upper layer 13c | CrN (Cr:N = 75:25) | 4 | Cr | Mixture gas of Ar and $N_2$ |
| Hard mask film 15 | | SiON (Si:O:N = 37:44:19) | 10 | Si | Mixture gas of Ar, $N_2$, $O_2$, and He |

It should be noted, however, that after the phase shift film 11 was formed by sputtering, annealing was performed at 450° C. for 30 minutes as post treatment after the film formation. When a transmittance and a phase difference with respect to a wavelength (about 193 nm) of the ArF excimer laser light were measured for the phase shift film 11 after the annealing with a phase shift amount measurement apparatus, the transmittance was 5.88%, and the phase difference was 177.9 degrees.

Moreover, after the lower layer 13a, the intermediate layer 13b, and the upper layer 13c were formed by sputtering in the stated order on the phase shift film 11, when an optical density (OD) with respect to the wavelength (about 193 nm) of the ArF excimer laser light was measured for the laminated structure of the light shielding film 13, which is formed of those layers, and the phase shift film 11, the optical density (OD) was 3.0 or more.

Moreover, when a light transmittance from the transparent substrate 10 to the light shielding film 13 with respect to light having a wavelength of 880 nm, which was used in positioning of the exposure apparatus, was measured, the light transmittance was 50% or less.

After the above-mentioned film formation by the sputtering, HMDS processing was performed on the front surface of the hard mask film 15. Subsequently, a resist film 17 made of a chemical amplification resist for electron beam lithography (PRL 009 manufactured by FUJIFILM Electronic Materials Co., Ltd.) was formed to have a film thickness of 100 nm in contact with the front surface of the hard mask film 15 by spin coating. Through the above-mentioned procedure, the mask blank 1, which had the structure in which the phase shift film 11, the light shielding film 13 having the three-layer structure, the hard mask film 15, and the resist film 17 were laminated in the stated order, was produced on the transparent substrate 10.

[Pattern Formation]

The phase shift mask 3 was produced through the following procedure using the produced mask blank 1. First, referring to FIG. 3A, on the resist film 17, a first pattern including the phase shift pattern and an alignment mark pattern, which is to be formed in the phase shift film, was drawn by electron beam lithography. The resist film 17 was then subjected to predetermined development processing and cleaning processing to form a first resist pattern 17a. The first resist pattern 17a was intended to form a phase shift pattern having 40-nm-wide lines and spaces, which correspond to the pattern dimensions of the SRAF pattern.

Next, as illustrated in FIG. 3B, the hard mask film 15 was dry-etched using a fluorine-based gas ($CF_4$) and using the first resist pattern 17a as a mask to form a hard mask pattern 15a in the hard mask film 15. Thereafter, the first resist pattern 17a was removed. Next, as illustrated in FIG. 3C, the light shielding film 13 was dry-etched using a mixture gas of a chlorine gas ($Cl_2$) and an oxygen gas (O) and using the hard mask pattern 15a as a mask to form the light shielding film pattern 13aa. At this time, an etching rate of the dry etching using the mixture gas of the chlorine gas ($Cl_2$) and the oxygen gas (O) in each layer of the light shielding film 13 had a ratio of an etching rate of the intermediate layer 13b of 1.8 when an etching rate of the upper layer 13c was set to 1. Moreover, a ratio of an etching rate of the lower layer 13a was 3.2 when the etching rate of the upper layer 13c was set to 1.

Then, as illustrated in FIG. 3D, the phase shift film 11 was dry-etched using a fluorine-based gas ($SF_6$) and using the light shielding film pattern 13aa as a mask. In this manner, the phase shift pattern 20a was formed in the phase shift pattern forming region 10a of the transparent substrate 10. Moreover, the hole-shaped alignment mark pattern 20b, which pierces through the light shielding film 13 and the phase shift film 11, was formed in the peripheral region 10b of the transparent substrate 10. At this time, the hard mask pattern 15a was also removed.

Next, as illustrated in FIG. 4A, a second resist pattern 31 was formed to have a shape that covers the peripheral region 10b of the transparent substrate 10. Thereafter, as illustrated in FIG. 4B, the light shielding film 13 was dry-etched using the mixture gas of the chlorine ($Cl_2$) gas and the oxygen gas ($O_2$) and using the second resist pattern 31 as a mask to form the light shielding pattern 20c, which was formed by patterning the light shielding film 13 in the ring shape that covers the peripheral region 10b. Next, as illustrated in FIG. 4C, the second resist pattern 31 was removed, and the predetermined processing, such as the cleaning, was performed to obtain the phase shift mask 3.

[Evaluation of Light Shielding Film Pattern 13aa (Before Etching the Phase Shift Film)]

Figure 5:
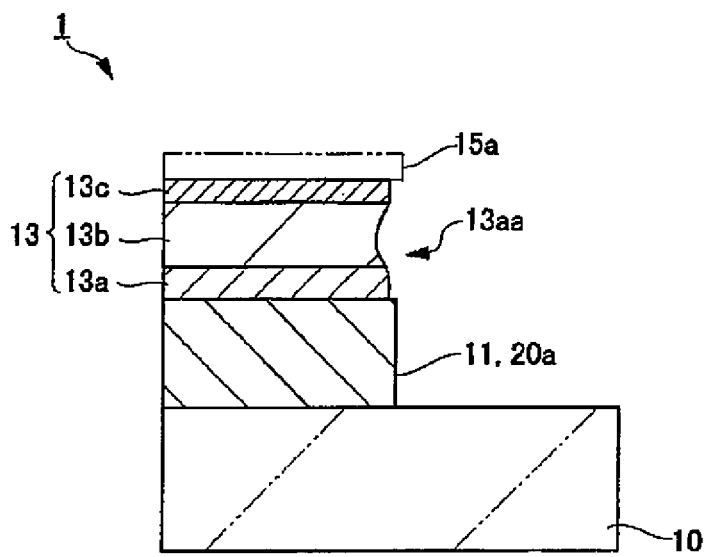
FIG. 5 is a cross-sectional view for illustrating a pattern formed in Example 1 of this invention.

In the pattern formation as described above, the light shielding film pattern 13aa was formed, and in a stage before the phase shift film 11 was etched (see FIG. 3C), a cross-sectional shape of the light shielding film pattern 13aa was checked. As a result, as illustrated in FIG. 5, the cross-sectional shape of the light shielding film pattern 13aa was a shape in which, although the wall surface of the pattern had a cross-sectional shape such that, although a subtle recess due to the side etching was seen in the intermediate layer 13b of the light shielding film pattern 13aa, the side etching was suppressed on the lower layer 13a and the pattern width was recovered on the lower layer 13a. Moreover, an amount of retraction of the upper layer 13c was small relative to the dimensions of the hard mask pattern 15a.

Moreover, when the light shielding film pattern 13aa was cleaned and then the state of the light shielding film pattern 13aa was checked at this stage, the collapse of the light shielding film pattern had not occurred. It is considered that this is because the pattern width was secured in the lower layer 13a of the light shielding film 13, and hence adhesion at an interface with the phase shift film 11 was secured.

[Evaluation of Phase Shift Pattern 20a]

When a shape of the phase shift pattern 20a, which had been formed by etching the phase shift film 11 using the light shielding film pattern 13aa as a mask, was evaluated, it was confirmed that a pattern shape with a small divergence from a planar shape of the first resist pattern 17a was obtained.

Moreover, AIMS 193 (manufactured by Carl Zeiss AG) was used on the phase shift mask 3 in Example 1 of this invention to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 1 is set on a mask stage of an exposure apparatus, and when the resist film on the semiconductor device is subjected to the transferring by the exposure, a circuit pattern to be finally formed on the semiconductor device can be formed with high accuracy.

Example 2

[Production of Mask Blank]

The mask blank 2 according to the second embodiment, which has been described with reference to FIG. 2, was produced as in the production procedure in Example 1. It should be noted, however, that for the sputter deposition of the light shielding film 13', there was used a sheet-type film forming apparatus using a DC sputtering method, in which the following two targets: a chromium (Cr) target and an indium (In) target were provided in a film forming chamber, and which was capable of applying voltages to the two targets at the same time. For the lower layer 13a' of the light shielding film 13', there was used a method in which sputtering deposition of the lower layer 13a' was started in a state in which the voltage was applied only to the chromium target, and in which the voltage applied to the indium target was gradually increased. As the sputtering gas at this time, a mixture gas of argon, helium, nitrogen, and carbon dioxide was used. As a result, the lower layer 13a' was formed to have the layer structure having the graded composition from the phase shift film 11 side (having a composition ratio of Cr:O:C:N=57:19:11:13 at %) to the upper layer 13*c* side (having a composition ratio of Cr:In:O:C: N=45:5:30:9:11 at %).

Moreover, for the upper layer 13*c* (CrN film having a composition ratio of Cr:N=73:27 at %) of the light shielding film 13', there was performed sputter deposition in which the voltage is applied only to the chromium target, and which uses a mixture gas of argon and nitrogen as a sputtering gas.

After the lower layer 13*a*' and the upper layer 13*c* were formed by sputtering in the stated order on the phase shift film 11, when an optical density (OD) with respect to the wavelength (about 193 nm) of the ArF excimer laser light was measured for the laminated structure of the light shielding film 13', which is formed of those layers, and the phase shift film 11, the optical density (OD) was 3.0 or more.

Moreover, a light transmittance from the transparent substrate 10 to the light shielding film 13' with respect to light having a wavelength of 880 nm was 50% or less.

[Pattern Formation]

The phase shift mask 3 was produced through a procedure similar to that in Example 1 using the produced mask blank 2.

[Evaluation of Light Shielding Film Pattern 13*aa*' (Before Etching the Phase Shift Film)]

Figure 6:
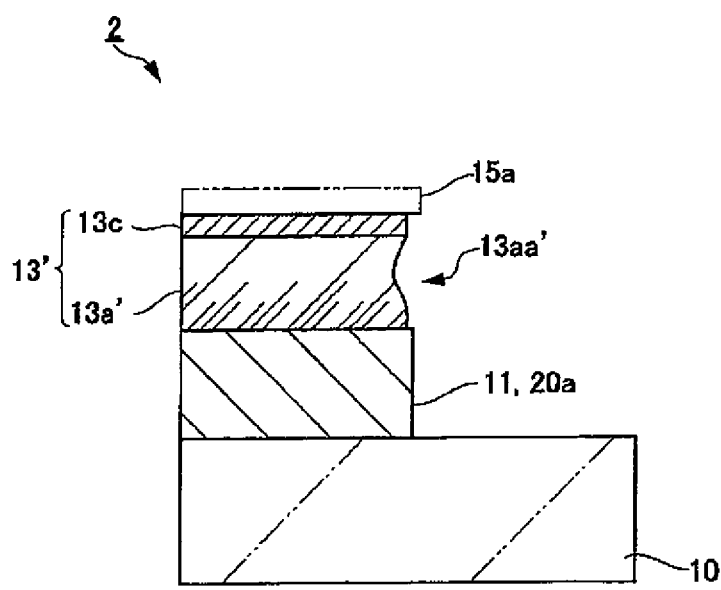
FIG. 6 is a cross-sectional view for illustrating a pattern formed in Example 2 of this invention.

A cross-sectional shape of the light shielding film pattern was checked as in Example 1. As a result, as illustrated in FIG. 6, the cross-sectional shape of the light shielding film pattern 13*aa*' was a shape in which, although hollowing of the wall surface of the pattern due to the side etching was seen in the upper layer 13*c* side of the lower 13*a*', the side etching was suppressed to recover the pattern width in the phase shift film 11 side of the lower layer 13*a*'. Moreover, retreat of the dimensions of the upper layer 13*c* was small with respect to the dimensions of the hard mask pattern 15*a*.

Moreover, when the state of the light shielding film pattern 13*aa*' after cleaning was checked, the collaspe of the light shielding film pattern 13*aa*' had not occurred. It is considered that this is because the pattern width was secured in the phase shift film 11 side of the lower layer 13*a*', and hence adhesion at an interface with the phase shift film 11 was secured.

[Evaluation of Phase Shift Pattern 20*a*]

When a shape of the phase shift pattern 20*a*, which had been formed by etching the phase shift film 11 using the light shielding film pattern 13*aa*' as a mask, was evaluated, it was confirmed that a pattern shape with a small divergence from a planar shape of the first resist pattern 17*a* was obtained.

Moreover, AIMS 193 (manufactured by Carl Zeiss AG) was used on the phase shift mask in Example 2 of this invention to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 2 is set on a mask stage of an exposure apparatus, and when the resist film on the semiconductor device is subjected to the transferring by the exposure, a circuit pattern to be finally formed on the semiconductor device can be formed with high accuracy.

Example 3

[Production of Mask Blank]

As another Example of the mask blank 1 according to the first embodiment, which has been described with reference to FIG. 1, a mask blank according to Example 3 of this invention was produced as in the production procedure in Example 1. It should be noted, however, that the intermediate layer 13*b* of the light shielding film 13 was formed by a DC sputtering method in which a mixed target (having a ratio of Cr:Sn=90:10 at %) of chromium (Cr) and tin (Sn) is provided in a film forming chamber, and which uses a mixture gas of argon, helium, nitrogen, and carbon dioxide as a sputtering gas. The intermediate layer 13*b* had a composition of CrSn:O:C:N=47:6:27:7:13 (ratio in at %).

After the lower layer 13*a*, the intermediate layer 13*b*, and the upper layer 13*c* were formed by sputtering in the stated order on the phase shift film 11, when an optical density (OD) with respect to the wavelength (about 193 nm) of the ArF excimer laser light was measured for the laminated structure of the light shielding film 13, which is formed of those layers, and the phase shift film 11, the optical density (OD) was 3.0 or more.

Moreover, a light transmittance from the transparent substrate 10 to the light shielding film 13 with respect to light having a wavelength of 880 nm was 50% or less.

[Pattern Formation]

The phase shift mask 3 in Example 3 was produced through the procedure similar to that in Example 1 using the produced mask blank 1 in Example 3.

[Evaluation of Light Shielding Film Pattern 13*aa* (Before Etching the Phase Shift Film)]

A cross-sectional shape of the light shielding film pattern was checked as in Example 1. As a result, as illustrated in FIG. 5, the cross-sectional shape of the light shielding film pattern 13*aa* was a shape in which, although hollowing of the wall surface of the pattern due to the side etching was seen in the intermediate layer 13*b* of the light shielding film pattern 13*aa*, the side etching was suppressed to recover the pattern width in the lower layer 13*a*. Moreover, retreat of the dimensions of the upper layer 13*c* was small with respect to the dimensions of the hard mask pattern 15*a*.

Moreover, when the light shielding film pattern 13*aa* was cleaned and then the state of the light shielding film pattern 13*aa* was checked at this stage, the collaspe of the light shielding film pattern had not occurred. It is considered that this is because the pattern width was secured in the lower layer 13*a* of the light shielding film 13, and hence adhesion at an interface with the phase shift film 11 was secured.

[Evaluation of Phase Shift Pattern 20*a*]

When a shape of the phase shift pattern 20*a*, which had been formed by etching the phase shift film 11 using the light shielding film pattern 13*aa* as a mask, was evaluated, it was confirmed that a pattern shape with a small divergence from a planar shape of the first resist pattern 17*a* was obtained.

Moreover, AIMS 193 (manufactured by Carl Zeiss AG) was used on the phase shift mask in Example 3 to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 3 is set on a mask stage of an exposure apparatus, and when the resist film on the semiconductor device is subjected to the transferring by the exposure, a circuit pattern to be finally formed on the semiconductor device can be formed with high accuracy.

Example 4

[Production of Mask Blank]

As another Example of the mask blank 2 according to the second embodiment, which has been described with reference to FIG. 2, a mask blank according to Example 4 of this invention was produced as in the production procedure in Example 2. It should be noted, however, that for the sputter deposition of the light shielding film 13', there was used a sheet-type film forming apparatus using a DC sputtering method, in which the following two targets: a chromium (Cr) target and a tin (Sn) target were provided in a film forming chamber, and which was capable of applying voltages to the two targets at the same time. For the lower layer 13a' of the light shielding film 13', there was used a method in which sputtering deposition of the lower layer 13a' was started in a state in which the voltage was applied only to the chromium target, and in which the voltage applied to the tin target was gradually increased. As the sputtering gas at this time, a mixture gas of argon, helium, nitrogen, and carbon dioxide was used. As a result, the lower layer 13a' was formed to have the layer structure having the graded composition from the phase shift film 11 side (having a composition ratio of Cr:O:C:N=58:18:10:14 at %) to the upper layer 13c side (having a composition ratio of CrSn:O:C:N=44:7:28:9:12 at %).

After the lower layer 13a' and the upper layer 13c were formed by sputtering in the stated order on the phase shift film 11, when an optical density (OD) with respect to the wavelength (about 193 nm) of the ArF excimer laser light was measured for the laminated structure of the light shielding film 13', which is formed of those layers, and the phase shift film 11, the optical density (OD) was 3.0 or more.

Moreover, a light transmittance from the transparent substrate 10 to the light shielding film 13' with respect to light having a wavelength of 880 nm was 50% or less.

[Pattern Formation]

The phase shift mask 3 was produced through the procedure similar to that in Example 1 using the produced mask blank 2 in Example 4.

[Evaluation of Light Shielding Film Pattern 13aa' (Before Etching the Phase Shift Film)]

A cross-sectional shape of the light shielding film pattern was checked in a manner similar to Example 2. As a result, as illustrated in FIG. 6, the light shielding film pattern 13aa' had a cross-sectional shape in which, although the wall surface of the pattern had a subtle recess resulting from the side etching as seen on the upper layer 13c side of the lower layer 13a', the side etching was suppressed on the phase shift film 11 side of the lower layer 13a' and the pattern width is recovered on the phase shift film 11 side of the lower layer 13a. Moreover, an amount of retraction of the upper layer 13c was small relative to the size of the hard mask pattern 15a.

Moreover, when the state of the light shielding film pattern 13aa' after cleaning was checked, the collapse of the light shielding film pattern had not occurred. It is considered that this is because the pattern width was secured in the phase shift film 11 side of the lower layer 13a', and hence adhesion at an interface with the phase shift film 11 was secured.

[Evaluation of Phase Shift Pattern 20a]

When a shape of the phase shift pattern 20a, which had been formed by etching the phase shift film 11 using the light shielding film pattern 13aa' as a mask, was evaluated, it was confirmed that a pattern shape with a small divergence from a planar shape of the first resist pattern 17a was obtained.

Moreover, AIMS 193 (manufactured by Carl Zeiss AG) was used on the phase shift mask in Example 4 to perform a simulation of a transfer image when transferred by exposure to exposure light having a wavelength of 193 nm on the resist film on the semiconductor device. When the image transferred by the exposure in the simulation was examined, the design specifications were sufficiently satisfied. This result shows that even when the phase shift mask 3 in Example 4 is set on a mask stage of an exposure apparatus, and when the resist film on the semiconductor device is subjected to the transferring by the exposure, a circuit pattern to be finally formed on the semiconductor device can be formed with high accuracy.

Comparative Example

[Production of Mask Blank]

Through the production procedure in Example 1, a mask blank was produced with only the conditions of forming the light shielding film being changed. The light shielding film was formed to have the single-layer structure (CrOCN film having a composition ratio of Cr:O:C:N=55:22:12:11 at %) having a film thickness of 46 nm.

After the light shielding film was formed by sputtering on the phase shift film, when an optical density (OD) with respect to the wavelength (about 193 nm) of the ArF excimer laser light was measured for the laminated structure of the light shielding film and the phase shift film, the optical density (OD) was 3.0 or more.

Moreover, a light transmittance from the transparent substrate to the hard mask film with respect to light having a wavelength of 880 nm was 50% or less.

[Pattern Formation]

The phase shift mask was produced through the procedure similar to that in Example 1 using the produced mask blank.

[Evaluation of Light Shielding Film Pattern (Before Etching the Phase Shift Film)]

Figure 7:
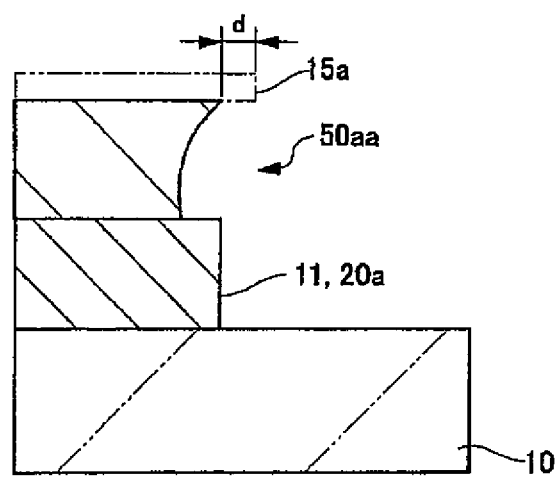
FIG. 7 is a cross-sectional view for illustrating a pattern formed in Comparative Example.

A cross-sectional shape of the light shielding film pattern was checked as in Example 1. As a result, as illustrated in FIG. 7, the cross-sectional shape of the light shielding film pattern 50aa was a shape that was retracted on the wall surface of the pattern and deepened toward the phase shift film 11 side. Moreover, a retract amount d in the upper layer portion of the light shielding film pattern 50aa was large relative to the dimensions of the hard mask pattern 15a, and lines were thinner than those in the pattern of the hard mask pattern 15a.

Moreover, when the state of the light shielding film pattern 50aa after cleaning was checked, the collapse of the light shielding film pattern 50aa had occurred. Therefore, when the state of the light shielding film pattern 50aa was checked for various line widths in the plane, the collapse of the pattern had not occurred with the pattern width of 80 nm or more. It is considered that this is because the cross-sectional shape of the light shielding film pattern 50aa was the shape that was deeply hollowed in the wall surface of the pattern toward the phase shift film 11 side to have a small contact area with the phase shift film, and hence an adhesion state that is enough to withstand the cleaning at an interface between the light shielding film pattern 50aa and the phase shift film could not be secured.

Moreover, AIMS 193 (manufactured by Carl Zeiss AG) was used on the phase shift mask in this Comparative Example to perform a simulation of a transfer image when transferred by exposure to exposure light having a wavelength of 193 nm on the resist film on the semiconductor device. When the image transferred by the exposure in the simulation was examined, a transfer defect attributable to the falling of the SRAF pattern in the phase shift pattern was observed. This result shows that when the phase shift mask in this Comparative Example is set on a mask stage of an exposure apparatus, and when the resist film on the semiconductor device is subjected to the transferring by the exposure, defective points are disadvantageously generated in a circuit pattern to be finally formed on the semiconductor device.

This invention has been described by way of preferred embodiments so far. However, it goes without saying that this invention is not limited to those embodiments and various modifications can be made thereto without departing from the gist of this invention, and those modifications are encompassed in the scope of this invention as well.

REFERENCE SIGNS LIST 1, 2 . . . mask blank, 3 . . . phase shift mask, 10 . . . transparent substrate, 11 . . . phase shift film, 13, 13' . . . light shielding film, 13a, 13a' . . . lower layer, 13b . . . intermediate layer, 13c . . . upper layer, 15 . . . hard mask film, 17 . . . resist film, 20a . . . phase shift pattern, 20c . . . light shielding pattern

The invention claimed is:

1. A mask blank having a structure in which, on a transparent substrate, a phase shift film, a light shielding film, and a hard mask film are laminated in the stated order from a transparent substrate side,
the phase shift film being formed of a material containing silicon,
the hard mask film being formed of a material containing at least one element selected from silicon and tantalum,
the light shielding film being formed of a material containing chromium, and having a laminated structure of three layers comprising a lower layer, an intermediate layer, and an upper layer,
the upper layer having a highest content of chromium in the light shielding film,
the intermediate layer having a lowest content of chromium in the light shielding film, and containing at least one metallic element selected from indium, tin, and molybdenum.

2. The mask blank according to claim 1, wherein the intermediate layer has a highest total content of the metallic element in the light shielding film.

3. The mask blank according to claim 1, wherein both of the upper layer and the lower layer do not contain the metallic element.

4. The mask blank according to claim 1, wherein the hard mask film is formed of a material containing silicon and oxygen.

5. The mask blank according to claim 1, wherein the phase shift film is formed of a material containing silicon and nitrogen.

6. The mask blank according to claim 1, wherein the light shielding film is capable of being patterned by dry etching using a mixture gas of a chlorine-based gas and an oxygen gas.

7. The mask blank according to claim 1, wherein the hard mask film and the phase shift film are capable of being patterned by dry etching using a fluorine-based gas.

8. A method of manufacturing a phase shift mask using the mask blank of claim 1, the method comprising the steps of:
forming a phase shift pattern in the hard mask film by dry etching using a fluorine-based gas and using as a mask a resist film having the phase shift pattern which is formed on the hard mask film;
forming the phase shift pattern in the light shielding film by dry etching using a mixture gas of a chlorine-based gas and an oxygen gas and using as a mask the hard mask film in which the phase shift pattern has been formed;
forming the phase shift pattern in the phase shift film and removing the hard mask film by dry etching using a fluorine-based gas and using as a mask the light shielding film in which the phase shift pattern has been formed; and
forming, after removing the hard mask film, a light shielding pattern in the light shielding film by dry etching using a mixture gas of a chlorine gas and an oxygen gas and using as a mask a resist film having the light shielding pattern which is formed on the light shielding film.

9. A phase shift mask having a structure in which, on a transparent substrate, a phase shift film in which a phase shift pattern is formed and a light shielding film in which a light shielding pattern is formed are laminated in the stated order from a transparent substrate side,
the phase shift film being formed of a material containing silicon,
the light shielding film being formed of a material containing chromium, and having a laminated structure of three layers comprising a lower layer, an intermediate layer, and an upper layer,
the upper layer having a highest content of chromium in the light shielding film,
the intermediate layer having a lowest content of chromium in the light shielding film, and containing at least one metallic element selected from indium, tin, and molybdenum.

10. The phase shift mask according to claim 9, wherein the intermediate layer has a highest total content of the metallic element in the light shielding film.

11. The phase shift mask according to claim 9, wherein both of the upper layer and the lower layer do not contain the metallic element.

12. The phase shift mask according to claim 9, wherein the phase shift film is formed of a material containing silicon and nitrogen.

13. The phase shift mask according to claim 9, wherein the light shielding film is capable of being patterned by dry etching using a mixture gas of a chlorine-based gas and an oxygen gas.

14. The phase shift mask according to claim 9, wherein the phase shift film is capable of being patterned by dry etching using a fluorine-based gas.

15. A method of manufacturing a semiconductor device, comprising an exposure step of patterning and transferring a transfer pattern of a phase shift mask, which is manufactured by the method of manufacturing a phase shift mask of claim 8, on a resist film on a substrate by a lithography method using the phase shift mask.

16. A method of manufacturing a semiconductor device, comprising an exposure step of patterning and transferring a transfer pattern of the phase shift mask of claim 9 on a resist film on a substrate by a lithography method using the phase shift mask.

17. A mask blank having a structure in which, on a transparent substrate, a phase shift film, a light shielding film, and a hard mask film are laminated in the stated order from a transparent substrate side, the phase shift film being formed of a material containing silicon, the hard mask film being formed of a material containing at least one element selected from silicon and tantalum, the light shielding film being formed of a material containing chromium, and having a laminated structure of a lower layer and an upper layer, the upper layer having a content of chromium higher than the lower layer, the lower layer having a graded composition so that a content of chromium becomes lower from a phase shift film side to an upper layer side, and containing at least one metallic element selected from indium, tin, and molybdenum on the upper layer side.

18. The mask blank according to claim 17, wherein a region of the upper layer side of the lower layer has a highest total content of the metallic element in the light shielding film.

19. The mask blank according to claim 17, wherein both of a region of the phase shift film side of the lower layer and the upper layer do not contain the metallic element.

20. The mask blank according to claim 17, wherein the hard mask film is formed of a material containing silicon and oxygen.

21. The mask blank according to claim 17, wherein the phase shift film is formed of a material containing silicon and nitrogen.

22. The mask blank according to claim 17, wherein the light shielding film is capable of being patterned by dry etching using a mixture gas of a chlorine-based gas and an oxygen gas.

23. The mask blank according to claim 17, wherein the hard mask film and the phase shift film are capable of being patterned by dry etching using a fluorine-based gas.

24. A phase shift mask having a structure in which, on a transparent substrate, a phase shift film in which a phase shift pattern is formed and a light shielding film in which a light shielding pattern is formed are laminated in the stated order from a transparent substrate side, the phase shift film being formed of a material containing silicon, the light shielding film being formed of a material containing chromium, and having a laminated structure of a lower layer and an upper layer, the upper layer having a content of chromium higher than the lower layer, the lower layer having a graded composition so that a content of chromium becomes lower from a phase shift film side to an upper layer side, and containing at least one metallic element selected from indium, tin, and molybdenum on the upper layer side.

25. The phase shift mask according to claim 24, wherein a region of the upper layer side of the lower layer has a highest total content of the metallic element in the light shielding film.

26. The phase shift mask according to claim 24, wherein both of a region of the phase shift film side of the lower layer and the upper layer do not contain the metallic element.

27. The phase shift mask according to claim 24, wherein the phase shift film is formed of a material containing silicon and nitrogen.

28. The phase shift mask according to claim 24, wherein the light shielding film is capable of being patterned by dry etching using a mixture gas of a chlorine-based gas and an oxygen gas.

29. The phase shift mask according to claim 24, wherein the phase shift film is capable of being patterned by dry etching using a fluorine-based gas.

* * * * *